(12) United States Patent
Mandlik et al.

(10) Patent No.: US 9,312,511 B2
(45) Date of Patent: Apr. 12, 2016

(54) EDGE BARRIER FILM FOR ELECTRONIC DEVICES

(75) Inventors: Prashant Mandlik, Lawrenceville, NJ (US); Ruiqing Ma, Morristown, NJ (US); Julia J. Brown, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 1021 days.

(21) Appl. No.: 13/422,926

(22) Filed: Mar. 16, 2012

(65) Prior Publication Data

US 2013/0244079 A1    Sep. 19, 2013

(51) Int. Cl.
*H01L 23/48*    (2006.01)
*H01L 51/52*    (2006.01)

(52) U.S. Cl.
CPC ........... *H01L 51/5253* (2013.01); *Y10T 428/23* (2015.01)

(58) Field of Classification Search
CPC ................... H01L 2224/97; H01L 2224/8592
USPC ................................................. 257/777–788
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,548,912 B1 | 4/2003 | Graff et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 2003/0197197 A1 | 10/2003 | Brown et al. | |
| 2003/0230980 A1 | 12/2003 | Forrest et al. | |

(Continued)

FOREIGN PATENT DOCUMENTS

CN    1678140 A    10/2005
CN    102148333 A    8/2011

(Continued)

OTHER PUBLICATIONS

J. C. Fisher, "Calculation of Diffusion Penetration Curves for Surface and Grain Boundary Diffusion" Journal of Applied Physics, 22 (1), pp. 74-77 (1951).

(Continued)

*Primary Examiner* — Cuong Q Nguyen
(74) *Attorney, Agent, or Firm* — Morris & Kamlay LLP

(57) ABSTRACT

In some embodiments, a first product is provided. The first product may include a substrate, a device having a device footprint disposed over the substrate, and a barrier film disposed over the substrate and substantially along a side of the device footprint. The barrier film may comprise a mixture of a polymeric material and non-polymeric material. The barrier film may have a perpendicular length that is less than or equal to 3.0 mm from the side of the device footprint.

24 Claims, 18 Drawing Sheets

(56) References Cited

U.S. PATENT DOCUMENTS

| | | | |
|---|---|---|---|
| 2004/0046497 A1 | 3/2004 | Schaepkens et al. | |
| 2004/0174116 A1 | 9/2004 | Lu et al. | |
| 2004/0195960 A1 | 10/2004 | Czeremuszkin et al. | |
| 2004/0201926 A1* | 10/2004 | Hancer et al. | 360/294.4 |
| 2005/0170210 A1 | 8/2005 | Kim et al. | |
| 2008/0102206 A1 | 5/2008 | Wagner | |
| 2008/0102223 A1 | 5/2008 | Wagner et al. | |
| 2011/0114994 A1 | 5/2011 | Mandlik et al. | |
| 2011/0193102 A1 | 8/2011 | Nam et al. | |

FOREIGN PATENT DOCUMENTS

| | | |
|---|---|---|
| JP | 2006059599 A | 3/2006 |
| WO | WO 2005/051525 | 6/2005 |
| WO | WO 2010/011390 | 1/2010 |

OTHER PUBLICATIONS

Eric Charles Suloff, Phd Thesis, "Sorption Behavior of an Aliphatic Series of Aldehydes in the Presence of Poly (ethylene terephthalate) Blends Containing Aldehyde Scavenging Agents," Virginia Polytechnic Institute and State University, Nov. 21, 2002.

K. Ghosal et al., "Gas separation using polymer membranes: An overview," Polym. Adv. Technol., 5, 673-697 (1994).

Hajimu Wakabayashi et al., "Diffusion of water into silica glass at low temperature" *J. Am. Cerum.* Soc., 72 [lo] 1850-55 (1989).

W.R. Vieth et al., "Transport properties and their correlation with the morphology of thermally conditioned polypropylene," Appl. Polym. Sci., 13, 685-712 (1969).

Goff, J. A. et al., "Low-pressure properties of water from −160 to 212° F.," in Transactions of the American Society of Heating and Ventilating Engineers, 52nd annual meeting of the American Society of Heating and Ventilating Engineers, New York, 1946, pp. 95-122.

Buck, A. L., "New equations for computing vapor pressure and enhancement factor", *J. Appl. Meteorol.* 20: 1527-1532, May 11, 1981.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

G. L. Graff, et al., "Mechanisms of vapor permeation through multilayer barrier films: Lag time versus equilibrium permeation," J. Appl. Phys., 96 (4), pp. 1840-1849 (2004).

Z. Chen, et al., "Molecular Dynamics Simulation of Water Diffusion Inside an Amorphous Polyacrylate Latex Film," Journal of Polymer Science: Part B: Polymer Physics, vol. 45, 884-891 (2007).

L.S. Pan et al.,, Electronic Properties and Applications, Springer, pp. 104-107, 1995.

P. Mandlik, et al., Applied Physics Letters, 92, (10), pp. 103309-1-103309-3 (2008).

U.S. Appl. No. 61/086,047, filed Apr. 8, 2008.
U.S. Appl. No. 11/783,361, filed Apr. 9, 2007.
U.S. Appl. No. 13/365,921, filed Feb. 3, 2012.
U.S. Appl. No. 12/990,860, filed May 5, 2009.
U.S. Appl. No. 13/422,924, filed Mar. 16, 2012.
Office Action for CN 201310084325.8, dated Dec. 30, 2015.

* cited by examiner

EDGE BARRIER FILM FOR ELECTRONIC DEVICES

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the structure of Formula I:

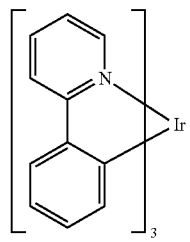

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Some embodiments provided herein may comprise products, and methods of manufacturing products, that comprise a barrier film (i.e. an edge sealant film or layer) that may decrease the degradation of a device and protect sensitive components from ingress of environmental contaminants such as water vapor (e.g. the barrier film may be utilized in electronic devices that consist of atmosphere sensitive components, such as electrodes or organic layers). The barrier film may be used in conjunction with any form of top encapsulation (such as a thin film encapsulation or glass encapsulation) and may provide an edge seal to increase the shelf lifetime of the encapsulated device. Moreover, the barrier film that forms the edge seal may have dimensions that are smaller than traditional edge sealant layers, thereby reducing the size of the border area (dead space) of the product.

In some embodiments, a first product is provided. The first product may include a substrate, a device having a device footprint disposed over the substrate, and a barrier film disposed over the substrate and substantially along a side of the device footprint. The barrier film may comprise a mixture of a polymeric material and non-polymeric material. The barrier film may have a perpendicular length that is less than or equal to 3.0 mm from the side of the device footprint.

In some embodiments, in the first product as described above, the device footprint may comprise an active device area and an inactive device area. In some embodiments, the barrier film may have a perpendicular length that is less than or equal to 3.0 mm from the side of the inactive device area. In some embodiments, the barrier film may not extend to a distance of greater than 3.0 mm from a side of the active device area.

In some embodiments, in the first product as described above, the device footprint may comprise an active device area, and the barrier film may have a perpendicular length that is less than or equal to 3.0 mm from the side of the active device area.

In some embodiments, in the first product as described above, the barrier film may comprise a mixture of a polymeric silicon and inorganic silicon. In some embodiments, the mixture of polymeric silicon and inorganic silicon is substantially uniform across the layer.

In some embodiments, in the first product as described above, the barrier film may have a perpendicular length that is less than or equal to 2.0 mm from the side of the device footprint. In some embodiments, the barrier film may have a perpendicular length that is less than or equal to 1.0 mm from the side of the device footprint.

In some embodiments, in the first product as described above, the barrier film may not have a perpendicular length that is greater than 3.0 mm from the side of the device footprint. In some embodiments, the barrier film may not have a perpendicular length that is greater than 2.0 mm from the side of the device footprint. In some embodiments, the barrier film does not have a perpendicular length that is greater than 1.0 mm from the side of the device footprint.

In some embodiments, in the first product as described above, the barrier film may not have a perpendicular length that is greater than 3.0 mm or less than 1.0 mm from the side of the device footprint. In some embodiments, the barrier film may not have a perpendicular length that is greater than 2.0 mm or less than 0.5 mm from the side of the device footprint.

In some embodiments, in the first product as described above, the barrier film may comprise a substantially uniform material. In some embodiments, the barrier film may comprise a uniform material.

In some embodiments, in the first product as described above, the barrier film may comprise a mixture of an oxide and polymeric silicone. In some embodiments, the barrier film may comprise at least 40% inorganic silicon. In some embodiments, the barrier film may comprise at least 60% inorganic silicon. In some embodiments, the barrier film may comprise at least 80% inorganic silicon.

In some embodiments, in the first product as described above, a surface of the barrier film may be disposed adjacent to a surface of the substrate to form a first interface, and the ratio of the index of refraction of the bulk of the barrier film and the index of refraction of a portion of the barrier film that is within 10 nm of the interface is between 0.9993 and 0.9247.

In some embodiments, in the first product as described above, where a surface of the barrier film is disposed adjacent to a surface of the substrate to form a first interface, the index of refraction of a portion of the barrier film that is within 10 nm of the interface may be between 1.35 and 1.459.

In some embodiments, in the first product as described above, where a surface of the barrier film is disposed adjacent to a surface of the substrate to form a first interface, the barrier film may comprise a material having a bulk diffusion coefficient of water vapor of less than $10^{-13}$ $cm^2$/sec. In some embodiments, the diffusion coefficient of water vapor at the first interface may be between $10^{-8}$ $cm^2$/sec and $10^{-13}$ $cm^2$/sec when exposed to an ambient temperate of 65° C. and relative humidity of 85%.

In some embodiments, in the first product as described above, where a surface of the barrier film is disposed adjacent to a surface of the substrate to form a first interface, the barrier film may comprise a material having a bulk diffusion coefficient of water vapor. The ratio of the bulk diffusion coefficient of water vapor of the barrier film and a diffusion coefficient of water vapor near the first interface may be between 1 and $10^{-5}$. In some embodiments, the ratio of the bulk diffusion coefficient of water vapor of the barrier film and a diffusion coefficient of water vapor within 10 nm of the first interface may be between 1 and $10^{-5}$.

In some embodiments, in the first product as described above, the device may further comprise a conductive layer disposed over the active device area. In some embodiments, a portion of the barrier film may be disposed at least partially over the conductive layer. In some embodiments, a portion of the barrier film may be disposed over the entire conductive layer.

In some embodiments, in the first product as described above where the device comprises a conductive layer disposed over the active device area, a top sealant layer may be disposed over the conductive layer. The top sealant layer and the barrier film may comprise different materials.

In some embodiments, in the first product as described above, the first product may comprise a border area (i.e. dead space). The border area may have a thickness that is less than 3.0 mm.

In some embodiments, in the first product as described above, where the first product comprises a border area, the border area may have a thickness that is less than 2.0 mm. In some embodiments, the border area may have a thickness that is less than 1.0 mm.

In some embodiments, the first product as described above may comprise a consumer device. In some embodiments, the first product may comprise anyone of: a solar cell, a thin film battery, an organic electronic device, a lighting panel or a lighting source having a lighting panel, a display or an electronic device having a display, a mobile phone, a notebook computer, a tablet computer, or a television.

In some embodiments, in the first product as described above, the device may comprise an organic layer. In some embodiments, the organic layer may comprise an electroluminescent material. In some embodiments, the device may comprise an OLED.

In some embodiments, a first method may be provided. The first method may comprise the steps of providing a substrate having a device having a device footprint disposed over the substrate, and fabricating a barrier film over the substrate and substantially along a side of the device footprint, where the barrier film may be fabricated so as to have a perpendicular length that is less than or equal to 3.0 mm from the side of the device footprint.

In some embodiments, in the first method as described above, the device footprint may comprise an organic layer. In some embodiments, the organic layer may comprise an electroluminescent (EL) material. In some embodiments, the device may comprise an OLED.

In some embodiments, in the first method as described above, the barrier film may be fabricated so as to have a perpendicular length that is less than or equal to 2.0 mm from the side of the device footprint. In some embodiments, the barrier film may be fabricated so as to have a perpendicular length that is less than or equal to 1.0 mm from the side of the device footprint.

In some embodiments, in the first method as described above, the step of fabricating the barrier film may comprise chemical vapor deposition. In some embodiments, the step of fabricating the barrier film may utilize an organosilicon precursor.

In some embodiments, in the first method as decried above, the step of fabricating the barrier film so as to have a perpendicular length that is less than or equal to 3.0 mm from the side of the device footprint may comprise depositing the barrier film through a mask such that the perpendicular length is less than or equal to 3.0 mm from the side of the device footprint.

In some embodiments, in the first method as described above, the step of fabricating the barrier film so as to have a perpendicular length that is less than or equal to 3.0 mm from the side of the device footprint may comprise the steps of: depositing a barrier film over the substrate and substantially along a side of the device footprint, wherein the barrier film is deposited so as to have a perpendicular length that is greater than or equal to 3.0 mm from the side of the device footprint, and, after depositing the barrier film, breaking the barrier film such that the barrier film has a perpendicular length that is less than or equal to 3.0 mm from the side of the device footprint. In some embodiments, the step of breaking the barrier film may be accomplished by, or in combination with, breaking the substrate.

In some embodiments, a first product prepared by a process may be provided. The process for preparing the first product may comprise the steps of providing a substrate having a device disposed over the substrate, where the device has a device footprint, and fabricating a barrier film over the substrate and substantially along a side of the device footprint, where the barrier film may be fabricated so as to have a perpendicular length that is less than or equal to 3.0 mm from the side of the device footprint.

In some embodiments, in the first product prepared by a process as described above, the device may comprise an organic layer. In some embodiments, the organic layer may comprise an organic electroluminescent (EL) material. In some embodiments, the device may comprise an OLED.

In some embodiments, in the first product prepared by a process as described above, the barrier film may be fabricated so as to have perpendicular length that is less than or equal to 2.0 mm from the side of the device footprint. In some embodiments, the barrier film is fabricated so as to have perpendicular length that is less than or equal to 1.0 mm from the side of the device footprint.

In some embodiments, in the first product prepared by a process as described above, the step of fabricating the barrier film may comprises depositing the first barrier film using an organosilicon precursor. In some embodiments, the step of fabricating the barrier film may comprise chemical vapor deposition. In some embodiments, the step of fabricating the barrier film may comprise plasma enhance chemical vapor deposition (PE-CVD). In some embodiments, the barrier film consists essentially of a mixture of polymeric silicon and inorganic silicon, where the weight ratio of polymeric silicon to inorganic silicon is in the range of 95:5 to 5:95, and where the polymeric silicon and the inorganic silicon are created from the same precursor material. In some embodiments, at least an 0.1 μm thickness of the barrier film is deposited under the same reaction conditions for all the reaction conditions in the deposition process and the water vapor transmission rate is less than $10^{-6}$ g/m$^2$/day through the at least 0.1 μm thickness of the barrier film.

In some embodiments, in the first product prepared by a process as described above, where the step of fabricating the barrier film comprises depositing the first barrier film using an organosilicon precursor, the precursor material may comprise hexamethyl disiloxane or dimethyl siloxane. In some embodiments, the precursor material may comprise a single organosilicon compound. In some embodiments, the precursor material may comprise a mixture of organosilicon compounds.

In some embodiments, in the first product prepared by a process as described above, the step of fabricating the barrier film may comprise depositing the barrier film through a mask such that the perpendicular length is less than or equal to 3.0 mm from the side of the device footprint. In some embodiments, the perpendicular length may be less than or equal to 1.0 mm from the side of the device footprint.

μm thick barrier film as a top encapsulation layer, in accordance with some embodiments. The footprint of the barrier film as the edge sealant and top encapsulation in this exemplary device was at least 2.0 mm larger than the footprint of the polymer material used in the OLED.

Figure 9A:
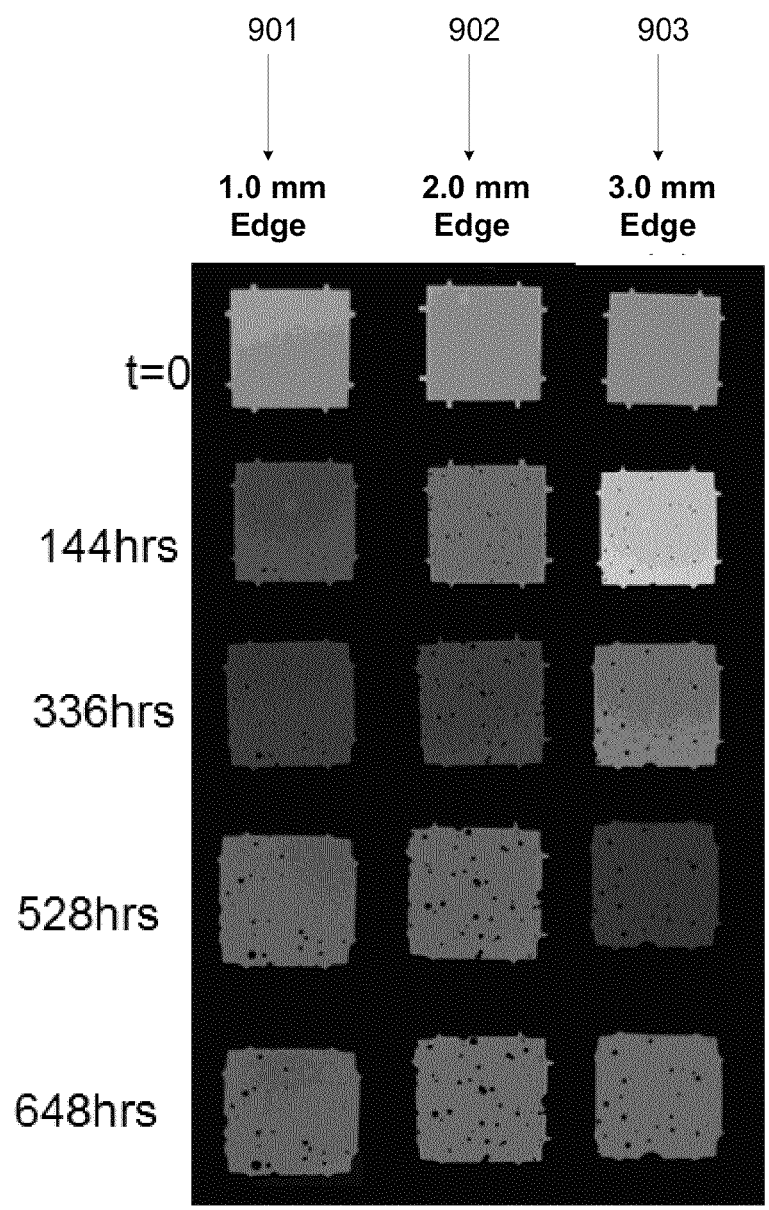
Figure 9B:
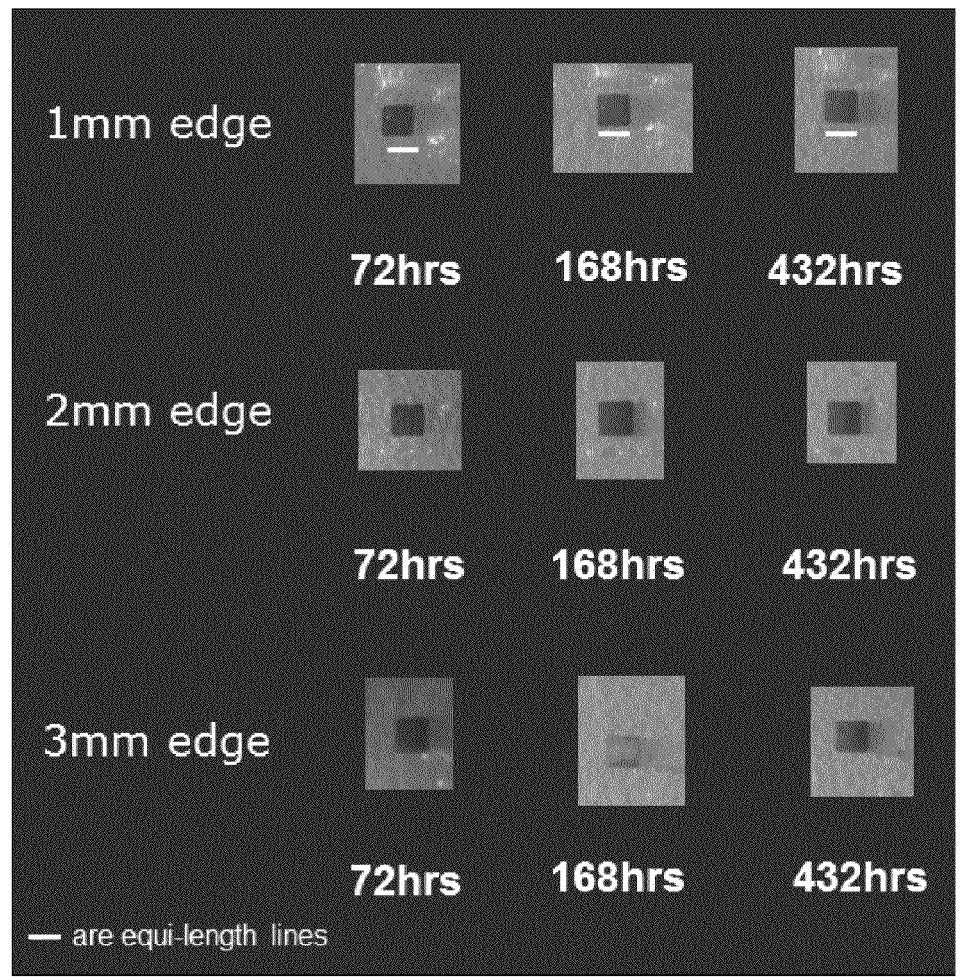

FIGS. 9(a) and 9(b) show experimental results for two tests conducted by the inventors.

FIG. 9(a) comprises photographs of the luminescent areas of three exemplary 1 $cm^2$ bottom emitting OLED test pixels coated with a 9.0 μm thick barrier film as the top encapsulation. The photographs were taken at the start of testing and after periods of accelerated storage at environmental conditions of 65° C. and 85% relative humidity (RH). The footprint of the barrier film as the edge sealant (i.e. the perpendicular length from the side of the device footprint) for each of the devices was (a) 1.0 mm, (b) 2.0 mm, and (c) 3.0 mm larger than the device footprint that comprises the organic material used in the exemplary OLED.

FIG. 9(b) comprises photographs of three exemplary 4.0 $mm^2$ calcium (Ca) buttons coated with a 9.0 μm thick barrier film as the top encapsulation. The photographs were taken during the periods of accelerated storage at environmental conditions of 85° C. and 85% RH. The footprint of the barrier film as the edge sealant (i.e. the perpendicular length from Ca button) for each of the devices was (a) 1.0 mm, (b) 2.0 mm, and (c) 3.0 mm larger than the footprint of Ca button.

Figure 10:
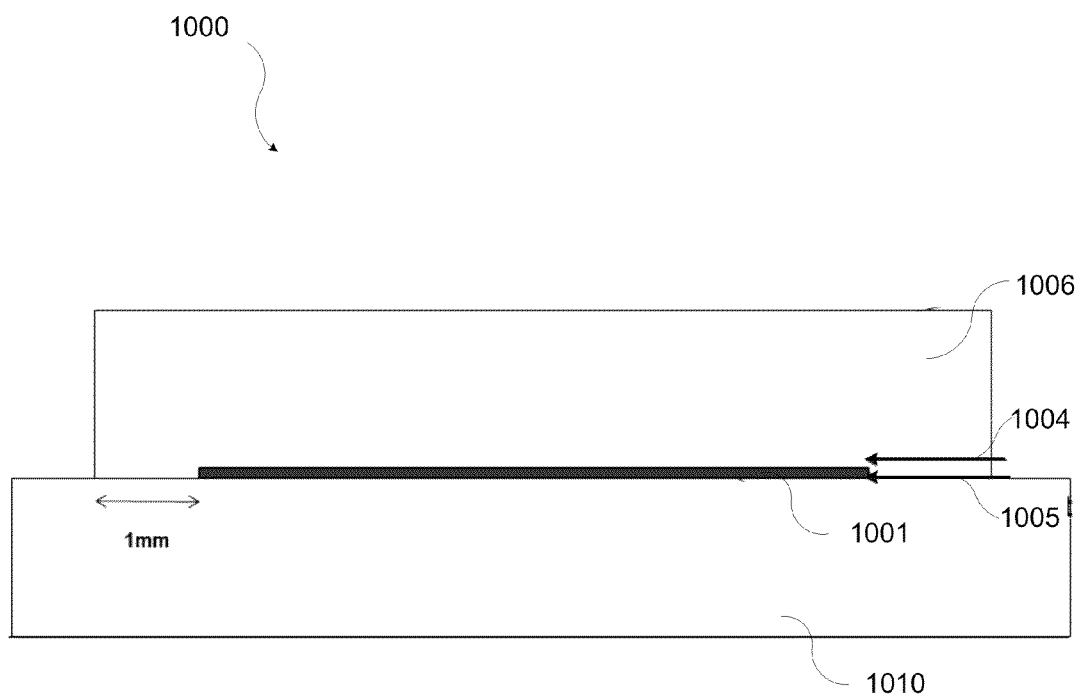

FIG. 10 shows a cross-section of an exemplary device in which the barrier film is used as the edge sealant and the top encapsulation, in accordance with some embodiments.

Figure 11:
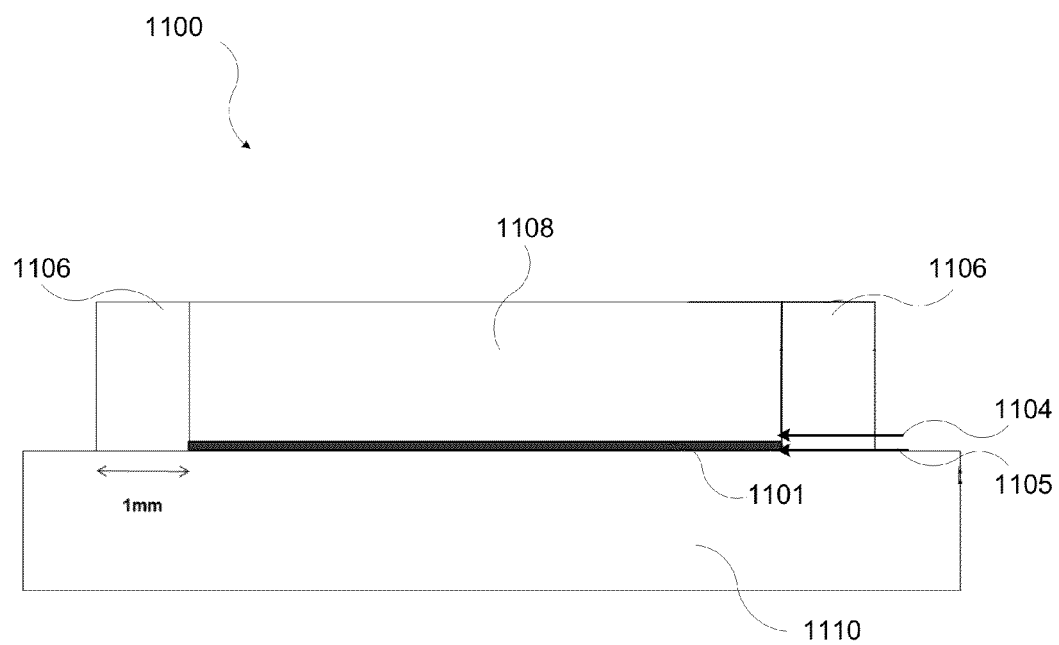

FIG. 11 shows a cross-section of an exemplary device in which the barrier film is used as an edge sealant, but is not used as the top encapsulation in accordance with some embodiments. The top encapsulation in this exemplary device comprises a single layer barrier film. The footprints of the mask used for the top encapsulation film in this exemplary embodiment may be approximately the same size as that used for the device footprint. The footprint of the mask used to deposit the barrier film as the edge sealant may be, for example, 1.0 mm larger than that of the device footprint.

Figure 12:
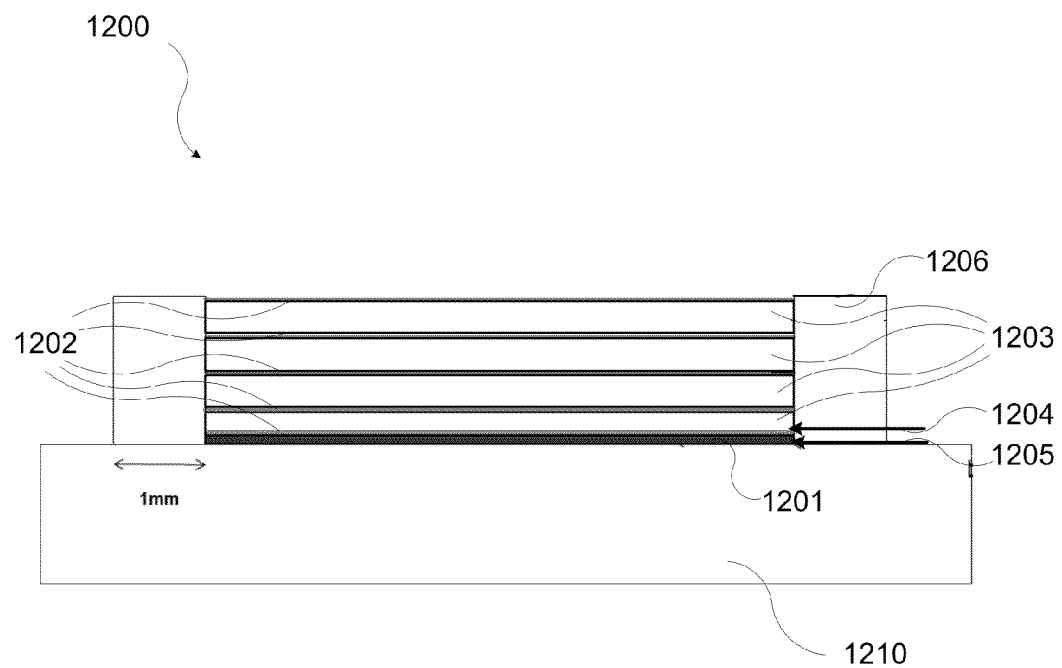

FIG. 12 shows a cross-section of an exemplary device in which the barrier film is an edge sealant, but it does not comprise the top encapsulation in accordance with some embodiments. The top encapsulation in this exemplary device is a multilayer barrier film. In this example, the footprint of the mask used for the top encapsulation may be the same size as that used for the device footprint. The footprint of the mask used to deposit the barrier film as the edge sealant may be, for example, 1.0 mm larger (or any suitable value) than that of the device footprint.

Figure 13:
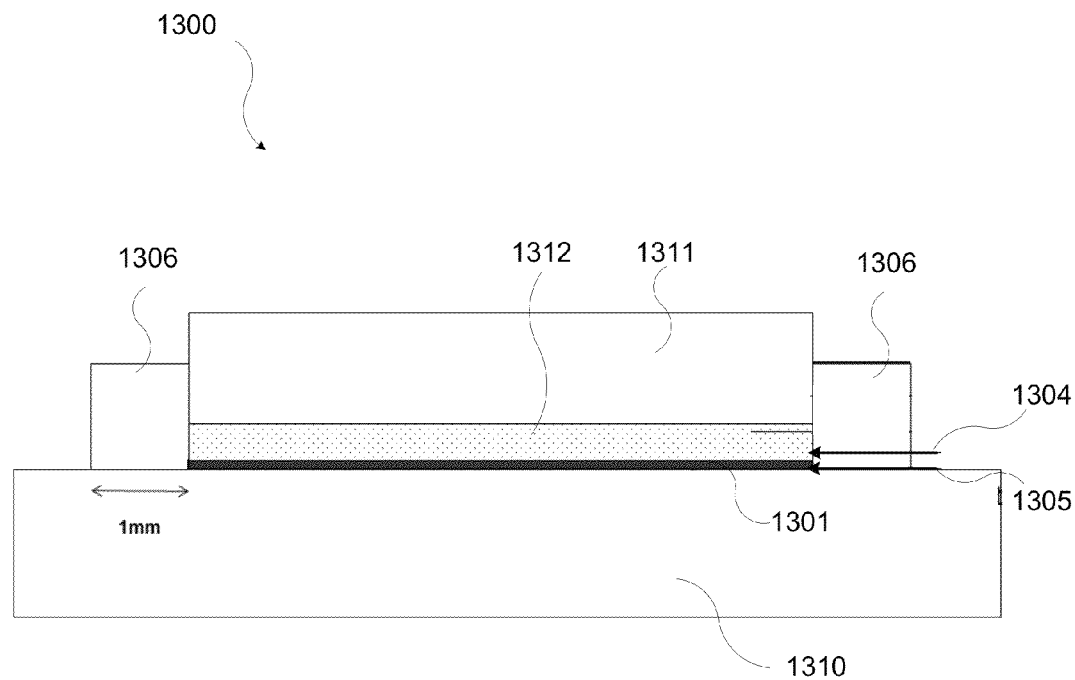

FIG. 13 shows a cross-section of an exemplary device in which the barrier film is an edge sealant, but it is not the top encapsulation in accordance with some embodiments. The top encapsulation in this example comprises a glass encapsulation using epoxy. The footprint of the mask used for the top encapsulation in this example may be the same size as that used for the device footprint. The footprint of the mask used to deposit the barrier film as the edge sealant may be 1.0 mm larger (or any suitable value) than that of the device footprint.

Figure 14:
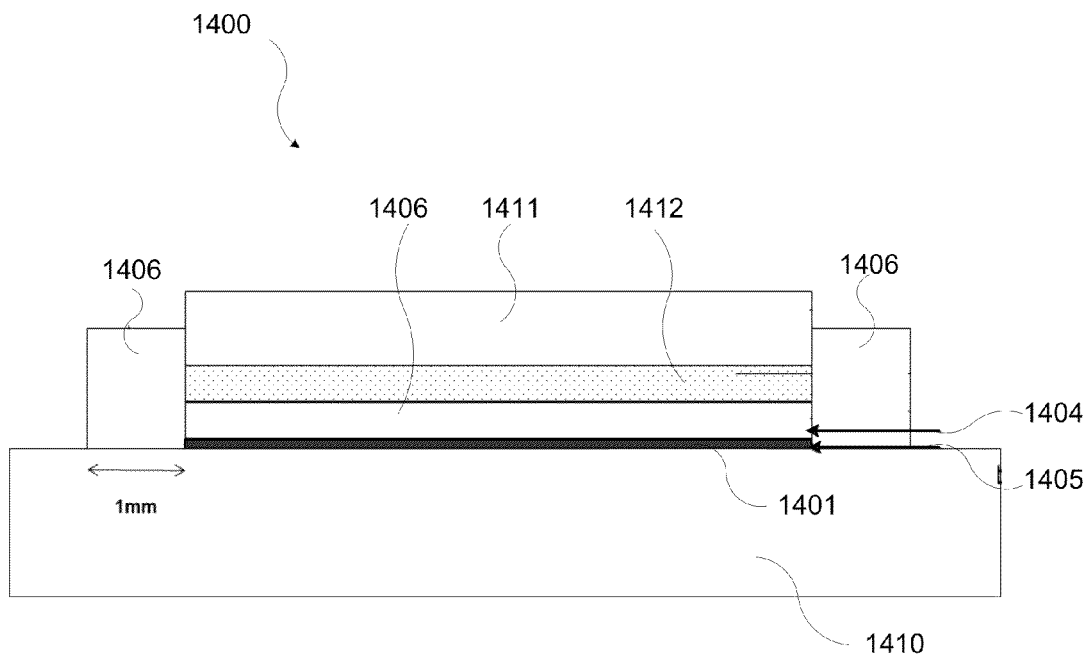

FIG. 14 shows a cross-section of an exemplary device in which the barrier film is an edge sealant and where the top encapsulation comprises a glass encapsulation using epoxy, in accordance with some embodiments. In this example, the epoxy is not deposited directly on the device (e.g. on one or more layers of the device such as a conductive layer), but a layer of barrier film is disposed between the epoxy and the device (or the one or more layers of the device).

Figure 15:
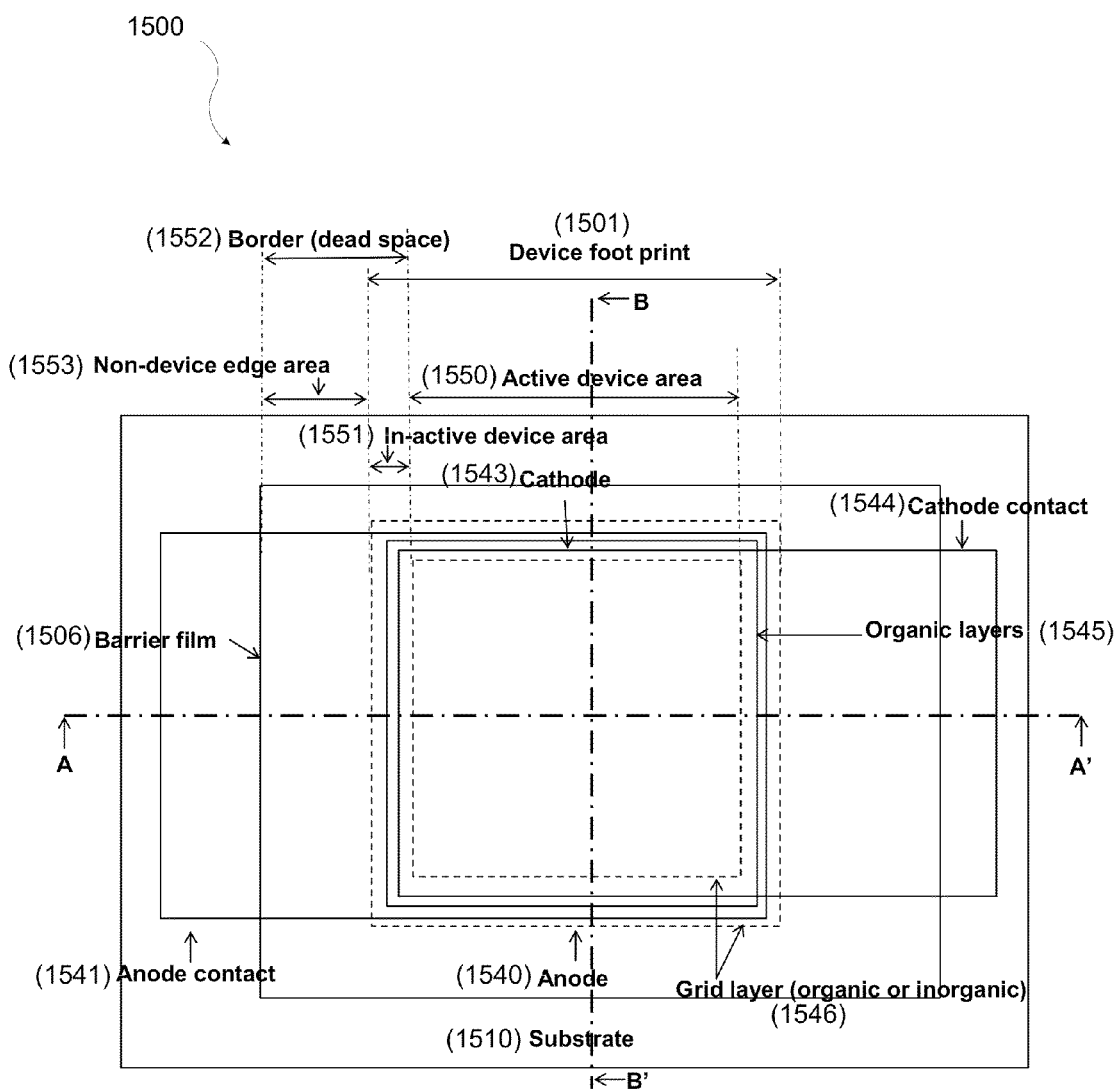

FIG. 15 shows a top-view of an exemplary product in accordance with some embodiments.

Figure 16:
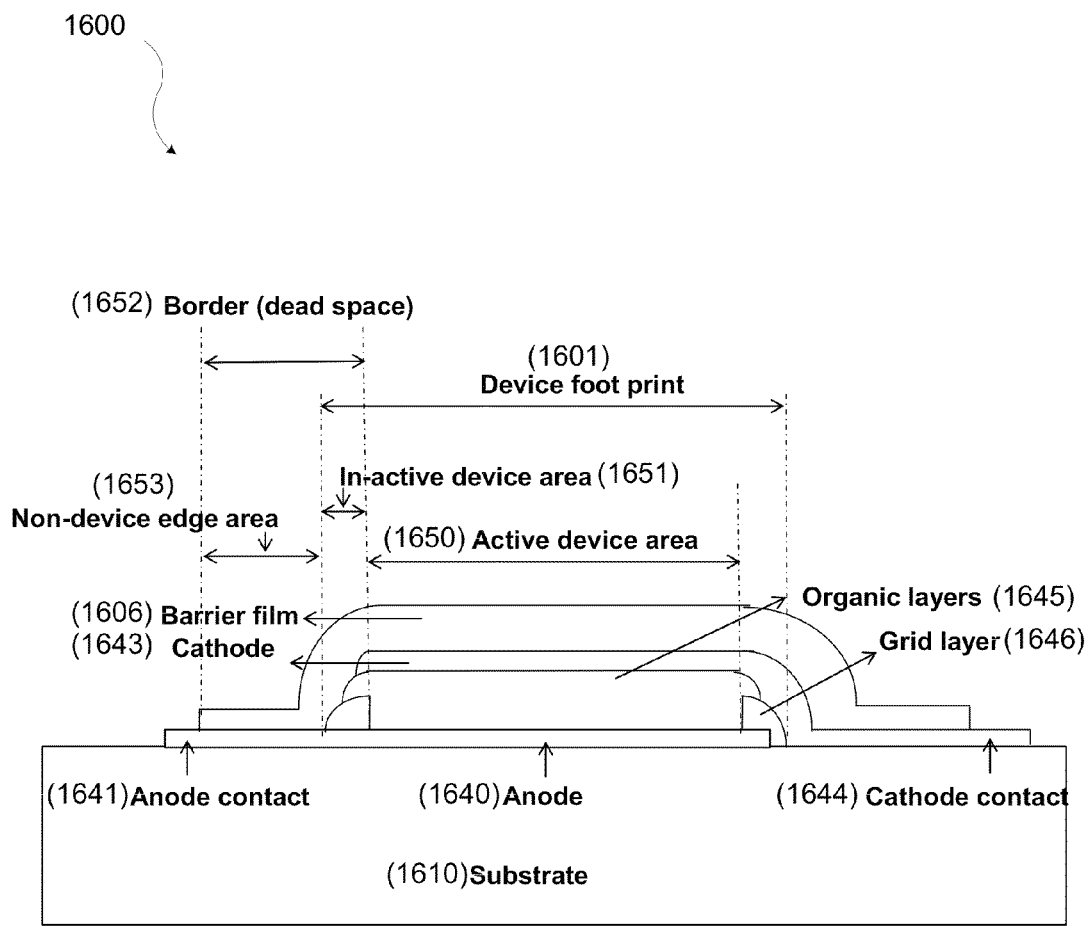

FIG. 16 shows a cross-sectional view of the exemplary product shown in FIG. 15 in accordance with some embodiments.

Figure 17:
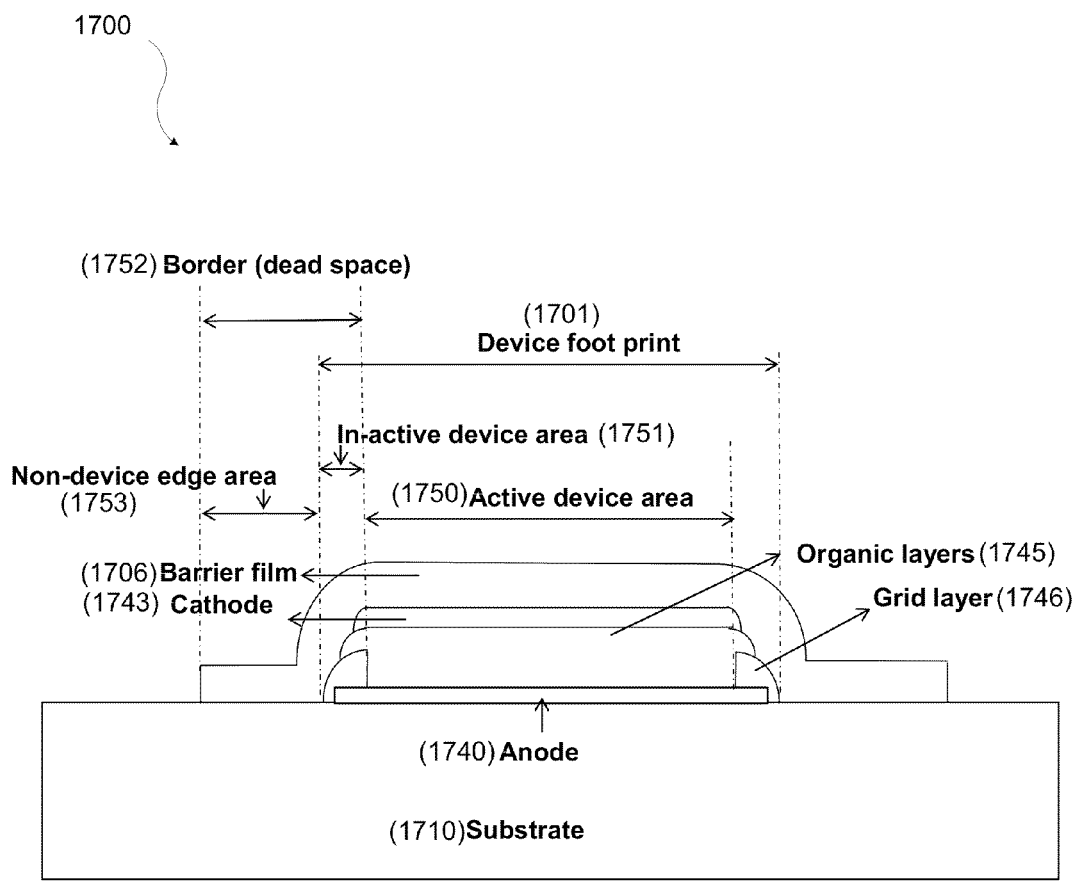

FIG. 17 shows a cross-sectional view of the exemplary product shown in FIG. 15 in accordance with some embodiments.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
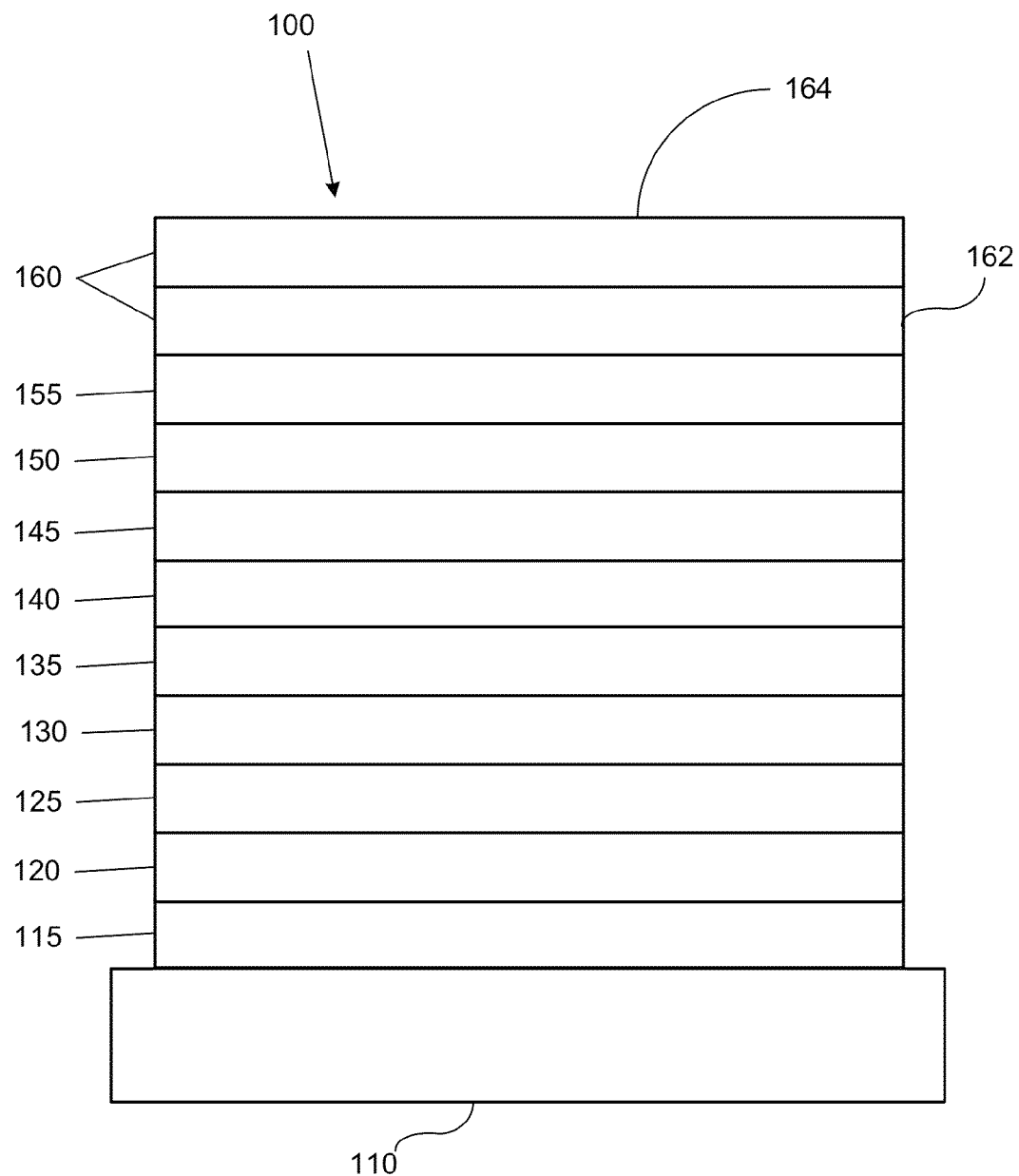
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat.

Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
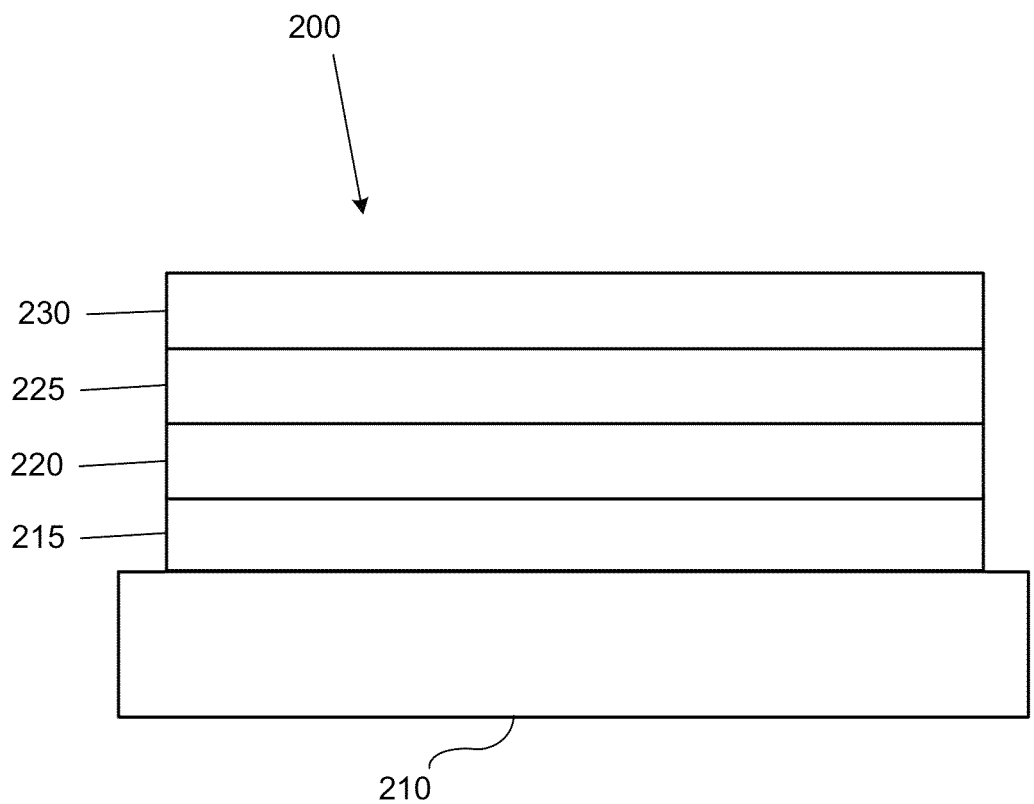
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, the "active device area" of a device may refer to the portion of the device in which electrons, holes, and/or photons are generated or absorbed and may comprise one or more organic and/or semi-conductor materials (such as organic semi-conductors or doped silicon). For organic electronic devices, the active device area may comprise one or more organic layers. For example, the active device area of an OLED may refer to the emissive area of the device (i.e. the portion of the device that emits light) and may include an organic electro-luminescent material. The active device area of a solar cell may refer to the portion of the device where photons are absorbed and electrons are released (e.g. it may refer to the portion of the device that comprises a semiconductor material). For a thin film battery, the active device area may refer to the electrolyte and may comprise, for example, lithium phosphorus oxynitride. These are just a few examples of active device areas of exemplary devices, and it should be appreciated that embodiments disclosed herein are not so limited.

As used herein, a "barrier film" or "barrier layer" may refer to a layer of material that may be utilized to decrease the permeation of gases, vapors, and/or moisture (or other environmental particulates) into the active device area of the device so as to increase lifetime and/or reduce performance degradation. In some embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "nonpolymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail below.

As used herein, the "border area" (i.e. dead space) of the device may comprise the combination of the "inactive device area" and the "non-device edge area." As used in this context, the "thickness" of the border area may refer to the distance from the device footprint to the edge of the border area (which may also comprise the edge of the substrate in some embodiments) in a direction that is perpendicular to a side of the device footprint.

As used herein, the term "comprising" is not intended to be limiting, but may be a transitional term synonymous with "including," "containing," or "characterized by." The term "comprising" may thereby be inclusive or open-ended and does not exclude additional, unrecited elements or method steps when used in a claim. For instance, in describing a method, "comprising" indicates that the claim is open-ended and allows for additional steps. In describing a device, "comprising" may mean that a named element(s) may be essential for an embodiment, but other elements may be added and still form a construct within the scope of a claim. In contrast, the transitional phrase "consisting of" excludes any element, step, or ingredient not specified in a claim. This is consistent with the use of the term throughout the specification.

As used herein, the "inactive device area" of a device may refer to portions of the device that comprises one or more layers of materials (such as organic layers) that are also included in the active area, but which does not comprise a part of the device where electrons, holes, and/or photons are generated or absorbed (i.e. it is not a part of the active device area of the device). For example, with regard to an OLED, the inactive device area may include one or more organic layers and/or a portion of an electrode, but this portion of the device may not include one or more of the other organic layers (or one or more electrodes) and therefore does not emit light. The inactive device area is often, but not always, the result of depositing an organic layer so as to extend beyond the edges of one of the electrodes to prevent or reduce the likelihood of shorting. In some instances, an insulating layer (e.g. "grid layer") may be disposed over the substrate and a portion of an electrode so as to electrically insulate the conductive layers of the device (see, e.g., FIGS. 15-17). These areas generally do not emit light and therefore would comprise a portion of the "inactive device area." In most instances, the inactive device area of the device is disposed adjacent to one or more sides of the active device area.

As used herein, the "device footprint" may refer to the total area of the "active device area" of the device and the "inactive device area" of the device. With reference to an organic device for illustration purposes, the device footprint may refer to the portion of the device in which one or more organic layers (i.e. the organic footprint) and/or one or more insulating grid layers are disposed over the substrate.

As used herein, a "non-device edge area" may refer to the area around the device footprint—that is, the portion of a product that does not include the "active device area" or the "inactive device area" of the device. For example, the non-device edge area may not comprise one or more of the layers that of the active device area of the device. With reference to organic electronic devices, the non-device edge area may refer to the portion of product that typically does not comprise an organic layer or an insulating layer (such as a grid layer that is disposed over one of the electrodes of the OLED). For instance, the non-device edge area may refer to the non-emitting areas of the OLED that do not comprise a part of the inactive device area. The non-device edge area may include the portions of the product in which one or more barrier films or layers are disposed along a side of the device footprint.

As used herein, the "perpendicular length" of the barrier film may refer to the distance from a portion of the barrier film that is disposed closest to the device footprint (e.g. adjacent to the active device area or inactive device area) to another portion of the barrier film that is disposed farthest away from the device footprint (e.g. an edge of the barrier film) in a direction that is perpendicular to the side of the device footprint and parallel to the surface of the substrate that the barrier film is disposed over. In other words, the perpendicular length may be a measure of the distance that the barrier film extends away from the device footprint (i.e. the footprint of the barrier film beyond the device footprint). The reason for utilizing the "side" of the device footprint as determining the perpendicular length is to generally exclude the corner effects, where the length of the barrier film may vary because of the shape of the device footprint. Thus, in general, the perpendicular length may correspond to the length of the barrier film disposed so as to provide resistance to the horizontal ingress of moisture (and other contaminants) into the active device area. In some embodiments, the perpendicular length may also correspond to the length of the barrier film adjacent to the substrate; however, embodiments are not limited such as when one or more conductive layers may extend beyond the device footprint (e.g. to make electrical connections), examples of which are illustrated in FIGS. 15 and 16 and described below.

It should be noted that although embodiments described below may make reference to organic devices such as OLEDs, embodiments are not so limited. The inventors have found that barrier films comprising a mixture of a polymeric material and a non-polymeric material as an edge sealant may be generally used in any thin film electronic device, particularly those that may have a component (or components) that is sensitive to environmental permeants such as water vapor. Moreover, the inventors have found that the exemplary barrier film may be used as an edge sealant having a perpendicular length (as described above) that is less than 3.0 mm (preferably less than 2.0 mm; and more preferably less than 1.0 mm)

while still providing adequate device performance and lifetime. This reduction in the size of the edge sealant may reduce the size of the non-active edge areas of such devices and thereby potentially reduce the border area and/or the overall size of a product (such as an electronic device) that comprises the exemplary barrier film as an edge sealant.

In general, electronic devices having moisture sensitive electronic components (such as water vapor sensitive electrodes) may degrade upon storage because of the atmospheric conditions. The degradation may be in the form of dark spots caused by the ingress of water vapor and oxygen vertically through the bulk of a thin film encapsulation (TFE) (or through particles embedded in the TFE), or by the ingress of water vapor and oxygen horizontally through the edge of the TFE. The TFE may also be referred to herein as a barrier layer or barrier film. The edge ingress of the water vapor typically occurs either via the horizontal permeation of the permeants (e.g. water vapor molecules) through the TFE itself (see, e.g., FIG. 6, 604 described below) or via the horizontal permeation of the permeants through the interface of the TFE with the underlying substrate (see, e.g., FIG. 6, 605 described below). The inventors have thereby found that it is preferred that a TFE providing an edge seal for an electronic device reduces both types of horizontal permeations (i.e. permeation across the layer itself and permeation at the interface between the layer and the substrate). In this regard, embodiments provided herein comprise an edge seal that may provide for improved performance and may be used for electronic devices that may be sensitive to atmosphere conditions, such as moisture.

Previous edge seals that were widely in use utilized multi-layer barriers. For example, many devices comprised multi-layer barriers that consisted of alternate layers of inorganic and polymer films. These barriers work on the principle of delaying the permeant molecules from reaching the device by forming a long and tortuous diffusion path. Some examples of these multilayer barriers will be described below.

Figure 3:
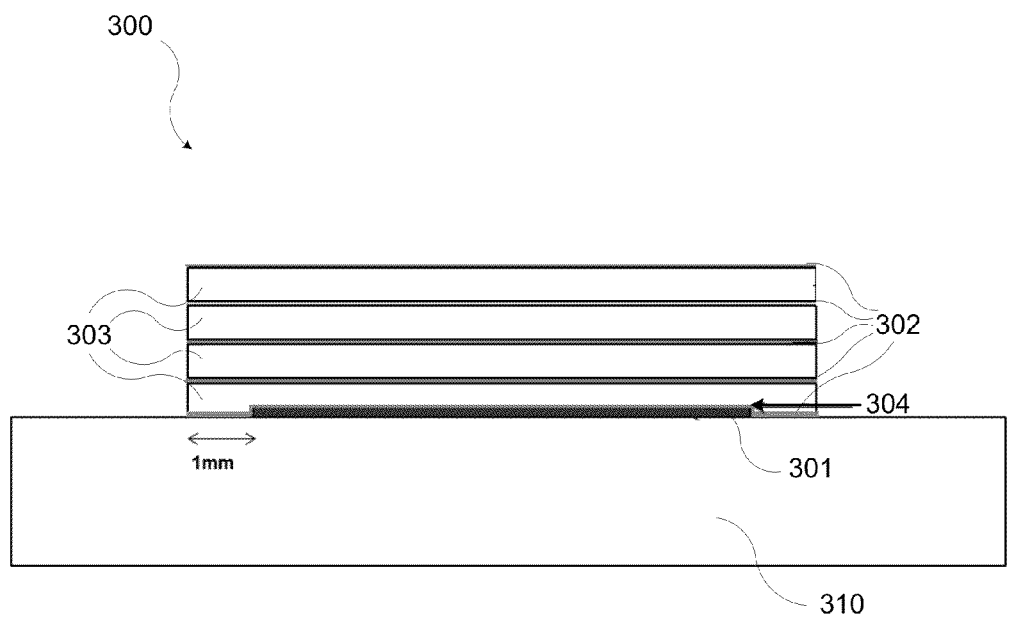
FIG. 3 shows a cross-section of an exemplary device having a multilayer barrier. The footprints of the deposition masks used for both inorganic and polymer films may be the same, which is larger than the device footprint by, for example, 1.0 mm in this exemplary device.

One of the prior methods for encapsulating a device with a multilayer barrier utilizes the same mask for both the inorganic and the polymer films; however, the size of the mask is larger than the footprint of a device so as to provide some edge ingress barrier (and also to allow for mask alignment tolerance). Assuming an alignment tolerance of 500 μm (which is reasonable for most fabrication processes) for both the device mask (e.g. the mask that may be used to deposit the layers that forth the active device area, inactive device area, and/or other components such as electrodes) and the encapsulation mask (e.g. the mask used to deposit the inorganic and the polymer films), this implies that the encapsulation mask should be about 1.0 mm larger than the device mask so as to prevent any device exposure when both the deposition of the device and the alignment of the encapsulation mask is off in the worst case scenario. It may also be assumed that the thickness of the inorganic film of the multilayer barrier is about 50 nm, and the thickness of the polymer film of multilayer barrier is about 800 nm, as is typically the case for such devices. FIG. 3 provides an example of such a device.

FIG. 3 shows a product 300 that comprises a substrate 310, a device 301 having a device footprint (which may include an active device area and an inactive device area) disposed over the substrate 310, and a plurality of inorganic layers 302 and polymer layers 303 that encapsulate the device 301. The product 300 of FIG. 3 shows a multilayer barrier encapsulation process consisting of a 5-layer stack that includes five inorganic layers (302) with four polymer layers (303) disposed between the organic layers (i.e. sandwiched between). In general, this type of masking and deposition method may be relatively simple to fabricate because it uses a minimum number of mask changes (thus adding minimum processing time for fabrication)—i.e. after the device 301 and corresponding components are deposited on the substrate, both the inorganic layer and the polymer layer may be deposited through a single mask. As shown in FIG. 3, this exemplary multi-layer barrier provides a direct path (i.e. Path-1 shown by the arrow 304) for water vapor to travel across the polymer layer 303 horizontally and reach the device 301 of product 300 (e.g. an environmentally sensitive electrode or organic layer) by permeating across just one inorganic layer 302 (i.e. the inorganic layer disposed adjacent to the device footprint of the device 301). Thus, the edge seal provided by this type of multilayer barrier as shown in FIG. 3 is mostly dependent on the permeation rate of water vapor across the polymer material 303 (which is typically higher than the permeation rate of the inorganic material). In general, for device designs such as those shown in FIG. 3, to achieve suitable device performance and lifetime, such a device would use a footprint for the encapsulation layer (e.g. the polymer 303 and inorganic 302 layers) that is much larger than the footprint of device 301. That is, the use of a single mask size for both inorganic 302 and organic 303 films that is larger than the device footprint to deposit the edge seal may not be a working or practical solution to providing a device with a minimal amount of border area (i.e. dead space). This is further illustrated in the example provided below.

The value of the diffusion constant of water vapor in polyacrylate polymer (a commonly used encapsulation material) at 25° C. can be calculated by using the diffusion constant ("D") of polyacrylate polymer at 38° C. as calculated by G. L. Graff, R. E. Williford, and P. E. Burrows, *Mechanisms of vapor permeation through multilayer barrier films: Lag time versus equilibrium permeation*, J. Appl. Phys., 96 (4), pp. 1840-1849 (2004) (i.e. the diffusion constant (D) at 38° C.~$8.5 \times 10^{-9}$ cm$^2$/sec), which is incorporated herein by reference in its entirety, and utilizing the activation energy of water vapor in such a polymer as was calculated by Z. Chen, Q. Gu, H. Zou, T. Zhao, H. WANG, *Molecular Dynamics Simulation of Water Diffusion Inside an Amorphous Polyacrylate Latex Film*, Journal of Polymer Science: Part B: Polymer Physics, Vol. 45, 884-891 (2007) (found to be approximately equal to 13 kJ/mole), which is also incorporated herein by reference in its entirety. In this manner, the diffusion constant of water vapor in polyacrylate polymer at 25° C. can be estimated to be ~$6.8 \times 10^{-9}$ cm$^2$/sec. Using this diffusion constant, the lag time of water vapor diffusion through Path-1 (304) for the device 300 shown in FIG. 3 can be estimated. As used in this context, the lag time ($t_l$) refers to the approximate diffusion time of permeant molecules (e.g. water vapor molecules) across a distance (l), and is related to the diffusion constant of the material by the relation given by: $t_l = l^2/(6D)$, as shown by Graff et al., *Mechanisms of vapor permeation through multilayer barrier films: Lag time versus equilibrium permeation*, J. Appl. Phys., 96 (4), pp. 1840-1849 (2004). Using the diffusion constant (D) of water vapor in polyacrylate polymer calculated above, the lag time at 25° C. may be calculated to be close to 70 hours for a path length of 1.0 mm. That is, for the exemplary encapsulation method shown in FIG. 3, it would generally take water vapor approximately 70 hours at room temperature to reach the inorganic layer 302 adjacent to the footprint of device 301 of the product 300 when traveling horizontally along Path-1 (304). Once the permeant crosses the polymer layer 303 along Path-1 (304), it need only permeate across just a single inorganic film layer 302 (which typically has a thickness of approximately 50 nm) to reach the footprint of device 301. The permeants can then reach the active device area quickly through defects (e.g.

pinholes, cracks, particles, etc.) and cause damage. Needless to say, this design may result in device degradation that is unacceptable for an intended purpose or application.

Figure 4:
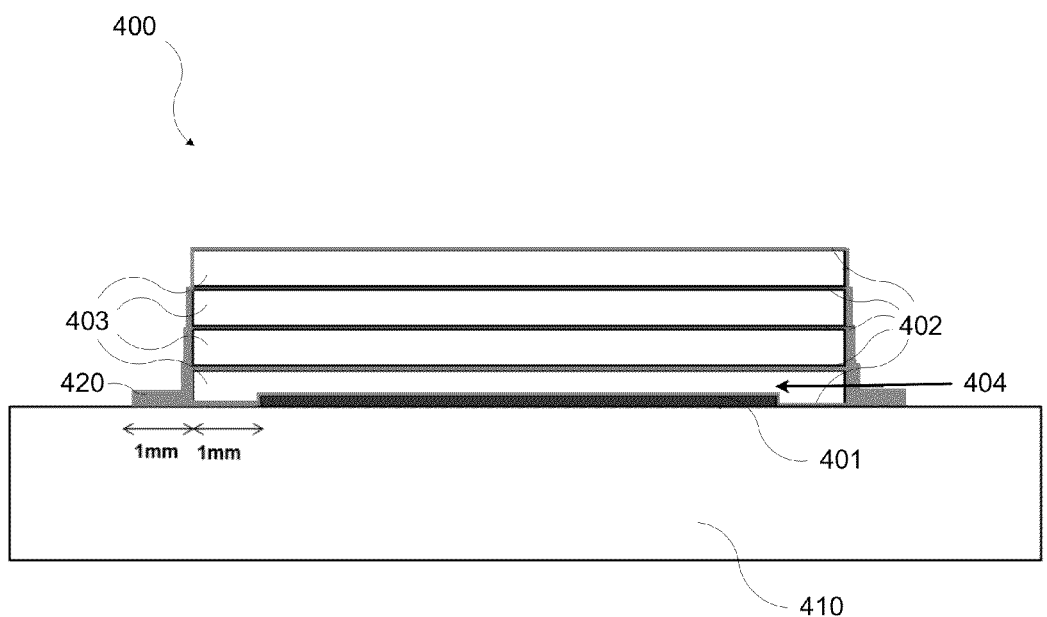
FIG. 4 shows a cross-section of an exemplary device having a multilayer barrier. The footprint of the mask used for the polymer film may be larger than the device footprint by, for example, 1.0 mm, and the footprint of the mask of the inorganic film may be larger than that of the polymer film by, for example, 1.0 mm.

Another approach using a multilayer barrier to encapsulate the device of a product is shown in FIG. 4. The product 400 comprises a substrate 410, a device 401 having a device footprint (which may comprise an active device area and an inactive device area) disposed on the substrate 410, and a plurality of inorganic layers 402 and polymer layers 403 disposed over the device 401. As shown, the device 400 uses an inorganic layer mask (used in depositing the inorganic layers 402) that is larger than the polymer layer mask (used in depositing the polymer layers 403) such that an inorganic layer 420 covers the side of the polymer layers 403. As shown in FIG. 4, even in this approach, the horizontal ingress path (i.e. Path-1 shown by the arrow 404) is the easiest path for water vapor to travel horizontally and reach the device 401 of the product 400. The barrier layer created by this method for the horizontal ingress path (i.e. Path-1 (404)) for the permeation of water vapor (or other permeants) for a 5-layer stack design is equivalent to a bi-layer barrier consisting of a first inorganic layer (typically 50 nm in thickness and disposed adjacent to the footprint of device 401), a second polymer layer (typically 800 nm in thickness), and a third inorganic layer (typically 200 nm in thickness labeled as 420 in FIG. 4). Therefore, as shown, the resistance to horizontal permeation that this type of multilayer barrier design provides is equivalent to a multilayer barrier consisting of two inorganic layers and a polymer layer disposed in-between (e.g. sandwiched between). Thus, while the vertical ingress comprises five inorganic barrier layers 402 and four polymeric layers 403, the horizontal ingress provides a much easier permeation path that may determine the lifetime or degradation of the device 401.

Figure 5:
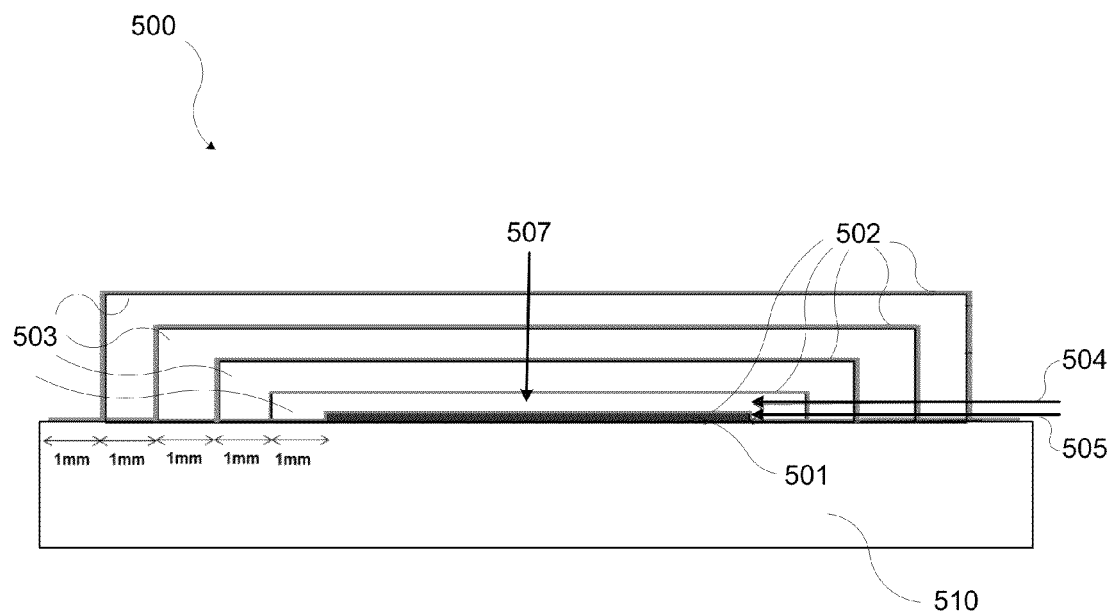
FIG. 5 shows a cross-section of an exemplary device having a multilayer barrier. The footprints of the masks used for each stack of inorganic and polymer film may be larger than the previous stack by, for example, 1.0 mm. The footprint of the first stack is larger than that of the device footprint of the device by, for example, 1.0 mm.

Yet another approach using a multilayer barrier design for a product is shown in FIG. 5. The product 500 comprises a substrate 510, a device 501 having a device footprint (which may comprise an active device area and an inactive device area) disposed over the substrate 510, and a plurality of inorganic 502 and polymer 503 layers disposed over and along the sides of the footprint of device 501. The barrier layers are deposited using increasingly larger sized masks for successive polymer 503 and inorganic layers 502. In this approach the water vapor travelling horizontally along Path-1 (shown by the arrow labeled 504) in the edge region of the product 500 faces the entire multilayer stack in its path before reaching the device 501 (unlike the products shown in FIGS. 3 and 4 described above). In this case, the edge seal provided by the multilayer barrier comprising layers 502 and 503 to the water vapor (or other permeant) travelling across the bulk of the barrier horizontally along Path-1 (504) is equivalent to the seal provided by the multilayer barrier to the water vapor travelling vertically across the bulk of the barrier (i.e. along Path-3 shown by the arrow 507).

However, even though the thickness of the polymer film per unit stack in the horizontal direction (typically ~1.0 mm each as shown in FIG. 5) is much greater than that of the thickness in the vertical direction (typically ~0.8 μm each), the resistance to water vapor diffusion across the layers is quite similar in both of the directions. The reason is that, as described by G. L. Graff, *Mechanisms of vapor permeation through multilayer barrier films: Lag time versus equilibrium permeation*, J. Appl. Phys., 96 (4), pp. 1840-1849 (2004), the effective thickness to calculate the length (l) in the lag time calculation ($t_l = l^2/(6D)$) is determined by either the thickness of the polymer film or the spacing of the defects in the inorganic film. In the vertical direction (i.e. along Path-3 (507)), the defect spacing of the inorganic film when assuming good permeation properties of the barrier layers (e.g. on the order of couple hundred microns) is much larger than the polymer film thickness. In the horizontal direction (i.e. along Path-1 (504)) the opposite is the case—that is, the defect spacing of the inorganic film is smaller than the polymer film thickness. Therefore, it is reasonable to assume that the edge ingress (e.g. Path-1 (504)) for the product 500 fabricated using a progressively increasing mask size approach is comparable to the vertical permeation (i.e. along Path-3 (507)) in the multilayer barrier.

Although two ingress paths were described above—i.e. horizontal Path-1 (504) and vertical Path-3 (507)—there is another potential ingress path for permeants (Path-2 shown by the arrow 505). Path-2 (505) corresponds to water vapor permeation along the interface of the inorganic film with the substrate 510. However, even if the interface permeation along Path-2 (505) for the inorganic film is worse than bulk permeation in the inorganic film, the length of the ingress path is rather large across the interface (e.g. approximately 5.0 mm as shown in FIG. 5), which is typically a large enough distance to make it a secondary ingress path in comparison to the ingress along Path-1 (504) (that is, permeants are more likely to reach the device 501 through Path-1 (504) before they reach the device 501 through Path-2 (505). One of the problems associated with the edge encapsulation approach shown in FIG. 5 of using progressively larger masks is the complexity associated with using the plurality of mask changes during fabrication—that is, each time a new mask is used during the fabrication process, it requires that the mask be properly aligned (adding to the time and expense of the process). In addition, the perpendicular length (e.g. footprint) of the barrier comprising the multiple inorganic 502 and polymer 503 layers is large (i.e. approximately 5.0 mm wider than that of the device 501 of the product 500 on each side). This may thereby increase the non-active edge area of the product around the footprint of device 501, which may, for instance, correspond to the border area of the device (i.e. non-emitting regions for an OLED), and also unnecessarily increases product size to accommodate the multiple barrier layers. Thus, the inventors have found that when attempting to reduce the edge ingress problem with an inorganic-polymer multilayer barrier, a long diffusion length may be needed so as to delay the water vapor (or other permeant) permeating in the horizontal direction (e.g. along Path-1 (504) or Path 2 (505)) along the edge of the product 500.

The inventors have discovered a barrier film material that comprises a mixture of a polymeric material and a non-polymeric material that can be used as an edge sealant. It should be noted that, in general, the barrier film comprising a mixture of a polymeric material and a non-polymeric material when used as an edge sealant can also be used in conjunction with a, for example, single layer barrier (i.e. a single layer barrier film), multilayer barrier (e.g. using multiple barrier layers comprising different materials), or glass encapsulation and epoxy. This barrier film 606 functioning as an edge sealant may be deposited in any suitable manner, including through the use of a single chamber PE-CVD system.

Figure 6:
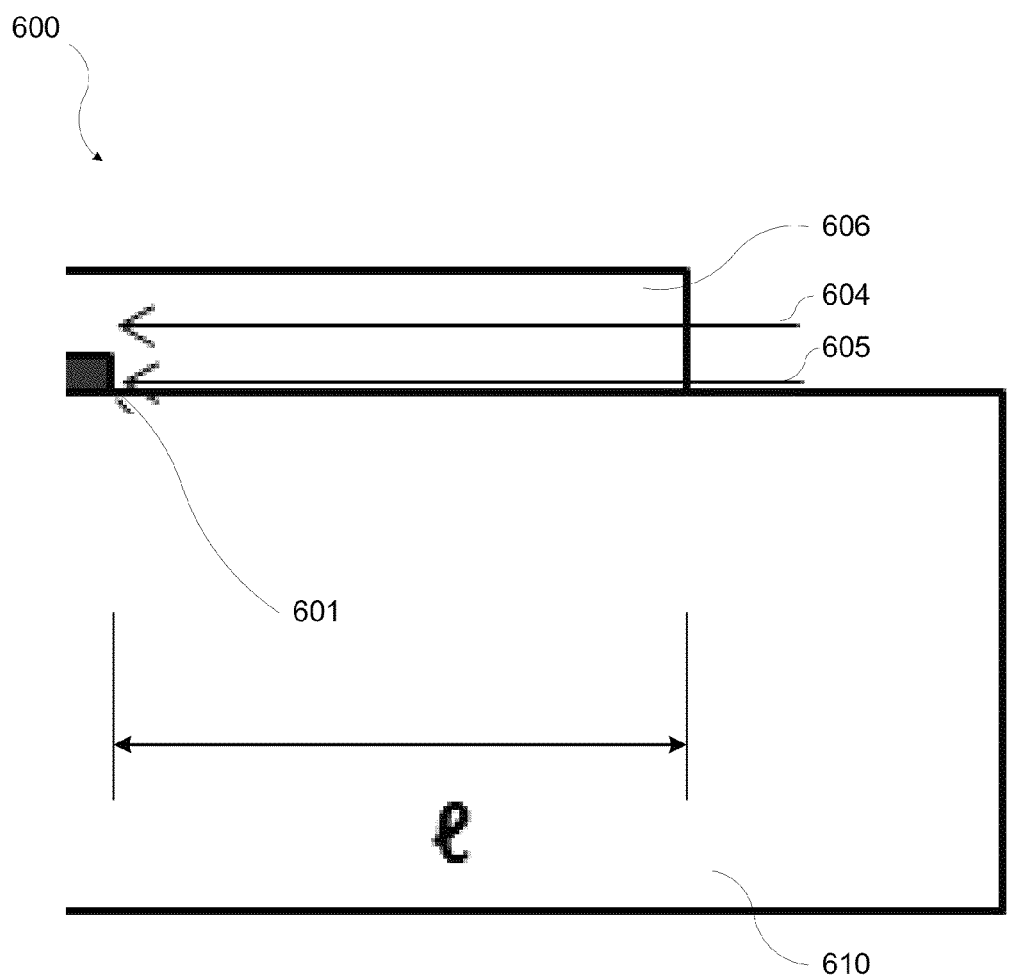
FIG. 6 shows a cross-section of a barrier film as an edge sealant for an exemplary device in accordance with some embodiments. The difference in the footprint of the mask used for the barrier film as the edge seal of this exemplary device and the device footprint is shown as ("l").

A cross-section of the barrier film 606 that comprises a mixture of a polymeric material and a non-polymeric on a product 600 is shown in FIG. 6. As described above, the two horizontal ingress paths for water vapor permeation are shown (Path-1 (604), which is the ingress along the bulk of the barrier film 606, and Path-2 (605), which is the ingress along the interface of the barrier film 606 with the substrate 610). As was described above, the barrier film 606 providing an edge seal has a footprint (i.e. a perpendicular length l that extends from a side of the footprint of device 601 to the edge of the barrier film 606 in a direction that is perpendicular to the side of the footprint of device 601) that can be varied based on the longevity requirements of the device. The inventors have found that the perpendicular length (or footprint) of the barrier film 606 can be made wider than the footprint of device 601 of the product 600 by 3.0 mm or less (preferably less than 2.0 mm and more preferable less than 1.0 mm), while still providing adequate restriction on the ingress of environmental particulates. It should be noted that the barrier film 606 can be made wider than the footprint of device 601 by more than 3.0 mm for extremely long shelf-life requirements or extremely harsh testing/storage conditions. As noted above, the exemplary barrier film that provides an edge seal may be deposited in a single chamber system. Moreover, in some embodiments, barrier film may form both the edge seal as well as the top encapsulation barrier. This can reduce fabrication costs and complexity when fabricating an electronic device. However, embodiments are not so limited, and the barrier film 606 may be used in combination with one or more encapsulation layers or components. Thus, the barrier film 606 that forms an edge seal may act as a standalone component of the overall encapsulation package, as described in more detail with reference to FIGS. 11-14.

Figure 7:
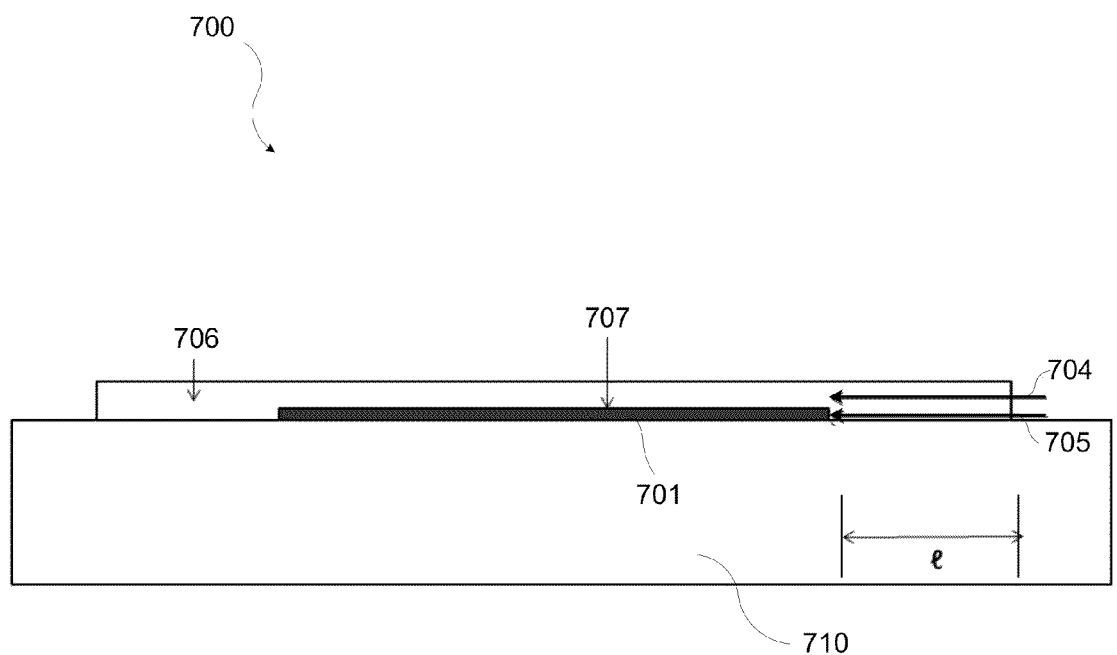
FIG. 7 shows a cross-section of an exemplary device having a barrier film as an edge sealant and also as the top encapsulation, in accordance with some embodiments.

As was described above, with reference to FIG. 6, there are two basic horizontal permeation paths (Path-1 and Path-2) across the edge sealant film. With reference to FIG. 7, an exemplary product 700 is shown that comprises a substrate 710, a device 701 having a device footprint (which may comprise an active device area and an inactive device area) disposed over the substrate 710, a barrier film 706 disposed along the sides and over the top of the device 701. The ingress along Path-1 (704), which is the horizontal bulk permeation, can be tested when the barrier film is used as both an edge sealant and as the top encapsulation film, as is the case with the exemplary product 700 in FIG. 7. In such a case, Path-3 (707), which is also bulk permeation like Path-1 (704) but in the vertical direction, has a much shorter diffusion path for water vapor than Path-1 (704). The length for Path-3 (707) in this example may be less than 10 $\mu$m, whereas the length (l) for Path-1 (704) (which corresponds to the perpendicular length of the barrier film) may be about 1000 $\mu$m (i.e. 1.0 mm or more). If the barrier film that is used as an edge sealant works well as a top encapsulation layer, then any measurable contribution in edge ingress from water vapor traveling via Path-1 (704) should be very low for a long duration of time because of the magnitude of the perpendicular length.

Figure 8:
FIG. 8 comprises photographs of the luminescent areas of a 2.0 mm$^2$ bottom emitting OLED test pixel coated with a 9.0

The inventors have tested an exemplary barrier film comprising a mixture of a polymeric material and a non-polymeric material when used as the top encapsulation layer and found that OLEDs encapsulated with this exemplary barrier film operate at 100% performance (i.e. with no degradation based on environmental conditions) for more than 500 hrs of storage at 85° C. and 85% RH. FIG. 8 shows the photographs of the active device area of a 2.0 mm$^2$ bottom-emission OLED encapsulated with the 9.0 $\mu$m thick exemplary barrier film comprising a mixture of a polymeric material and a non-polymeric material used as a top encapsulation stored at 85° C. and 85% relative humidity (RH). In particular, FIG. 8 shows pictures taken at different operating times (e.g. 0 hrs, 168 hrs, 240 hrs, 410 hrs, 460 hrs, and 530 hrs). As shown in FIG. 8, no dark spots developed in the device even after 530 hrs in such relatively harsh atmospheric conditions. Therefore, based on these results, it may be concluded that for the exemplary barrier film that is being used as an edge sealant, any permeation along Path-1 (704) corresponding to the bulk permeation across the film does not cause device degradation for a relatively long duration of storage (e.g. in excess of 530 hrs). It should be noted that when there are particulates embedded in the barrier film when used as both an edge sealant and a top encapsulation, dark spots may be observed; however, the dark spots are the results of permeation of water vapor across the particulates and not the barrier film itself.

The inventors then tested the exemplary barrier film's edge sealing ability by using different perpendicular lengths (i.e. edge lengths or footprints, such as (l) shown in FIGS. 6 and 7) for several devices and then measuring the lag time associated with those perpendicular lengths in two separate experiments, the results of which are shown in FIGS. 9(a) and (b). With reference to the first experiment shown in FIG. 9(a), for each of the three test devices, the barrier film comprising a mixture of a polymeric material and a non-polymeric material was also used as the top encapsulation, but the thickness in the vertical direction of the film was kept the same for each device. FIG. 9(a) shows the photographs of the active device area of three 1.0 cm$^2$ bottom-emission OLEDs encapsulated by the exemplary barrier film having top encapsulation layer thickness of 9.0 $\mu$m and stored at 65° C. and 85% RH. The perpendicular lengths (l) (measured from a side of the device footprint of the device) of the barrier film used to edge seal the devices shown in FIG. 9(a) are 1.0 mm, 2.0 mm, and 3.0 mm for each of the test devices, respectively (that is, the photos in column 901 are of the active device area of an exemplary OLED having a barrier film that has a perpendicular length of 1.0 mm from a side of the device footprint; the photos of column 902 of the active area of an exemplary OLED having a barrier film that has a perpendicular length of 2.0 mm measured from a side of the device footprint; and the photos in column 903 are of the active area of an exemplary OLED having a barrier film that has a perpendicular length of 3.0 mm measured from a side of the device footprint). As was noted above, the perpendicular length in this case corresponds to the distance between the side of the device footprint (in this case, the side of an inactive device area that was disposed adjacent to the active device area of the OLED) and the edge of the barrier film (i.e. the footprint of the barrier film layer). Therefore, although the distance that the barrier film extends away from the device active area may be slightly larger than the perpendicular length of the barrier film (i.e. by the thickness of the inactive device area), once water vapor reaches the organic layers or insulating layers that may comprise the inactive device area, it would face no barrier in propagating further into the active device area of the device.

The exemplary devices tested in FIG. 9(a) were larger area devices relative to the device tested with reference to FIG. 8 and therefore had more particulate contamination in the barrier films, resulting in the development of more dark spots. However, as can be seen in FIG. 9(a), the inventors did not find an appreciable difference in the edge ingress performance of the three devices (that is, after 648 hrs, there is approximately the same amount of dark spots in each device). Moreover, the inventors found that, even after a storage time of almost 1,000 hrs at 65° C. and 85% RH, the three devices appeared similar. Thus, as noted above, the degradation in each of the three devices could be attributed to ingress based on the particulate contamination of the barrier film. In view of the results shown in FIG. 9(a), a barrier film having a 3.0 mm perpendicular length or less (e.g. less than 2.0 mm, or less than 1.0 mm) of this exemplary barrier film comprising a mixture of polymeric material and a non-polymeric material can provide adequate resistance to the ingress of environmental permeants for at least 1,000 hrs or more at 65° C. and 85% RH.

As was noted above, the horizontal bulk permeation across a 1.0 mm length of the exemplary barrier film comprising a mixture of a polymeric material and a non-polymeric material would likely not be possible in such a short duration of time. Therefore, the edge degradation of these exemplary devices, which was generally held at acceptable levels for approximately 1,000 hrs, is likely the result of ingress at the interface (i.e. the ingress across the interface between the barrier film and the substrate across Path-2 discussed above). By further using the lag time calculation, the interface diffusion coefficient for water vapor for this particular exemplary barrier film comprising a mixture of a polymeric material and a non-polymeric material (as used on test devices tested in FIG. 9($a$)) was determined to be about $4.6 \times 10^{-10}$ cm$^2$/sec at 65° C. and 85% RH.

The inventors have further found that the interface diffusion coefficient for products utilizing a barrier film comprising a mixture of a polymeric material and a non-polymeric material as an edge seal may be controlled in some instance by applying one or more techniques. For example, one such technique may be to change the nucleation density. The nucleation density is the thin film growth technique that determines the thickness by which the growing film becomes dense and coherent. In general, before the film becomes dense it remains porous, and hence permeable. The refractive index of the film prior to it becoming completely dense and coherent will be lower than that of the bulk film. L. S. Pan, D. R. Kania, *Diamond: Electronic Properties and Applications*, Springer, pp. 104-107, (1995), which is incorporated herein by reference in its entirety, describes that the nucleation density is inversely proportional to the square of film thickness by which a film becomes dense. That means that to form a coherent and continuous film of thickness (d), the nucleation density $(N_d) \sim 1/d^2$. Thus, for a nucleation density of $10^{10}$ cm$^{-2}$, the film would become continuous when it reaches 100 nm.

In another similar experiment, the results of which are shown in FIG. 9($b$), the inventors again tested the exemplary barrier film's edge sealing ability by using three test devices having barrier films with different perpendicular lengths (i.e. edge lengths or footprints, such as (l) shown in FIGS. 6 and 7) and then measuring the lag time associated with those perpendicular lengths, but under harsher environmental conditions. For each of the experimental devices, the barrier film comprising a mixture of a polymeric material and a non-polymeric material was also used as the top encapsulation, but the thickness in the vertical direction of the film was kept the same for each device. The platform chosen for the test was coupons containing 4.0 mm$^2$ calcium (Ca) buttons. FIG. 9($b$) shows the photographs of the three 4.0 mm$^2$ Ca buttons encapsulated by the exemplary barrier film having top encapsulation layer thickness of 9.0 μm and stored at 85° C. and 85% RH. The perpendicular lengths (l) (in this case, the perpendicular distance from the side of the Ca (i.e. the active device area because there was no inactive device area) to the edge of the barrier film) of the barrier film used to edge seal the buttons shown in FIG. 9($b$) are 1.0 mm, 2.0 mm, and 3.0 mm for the buttons shown in the top, middle, and bottom rows, respectively. As noted above, these tests were even tougher than those described with reference to FIG. 9($a$), as the active device area (i.e. Ca buttons) was 1.0, 2.0, and 3.0 mm away from the edge of the barrier film. Once water vapor reaches the Ca button, it would start to become transparent due to formation of hydroxide.

The exemplary devices tested in FIG. 9($b$) were facing an even more daunting challenge than those shown in FIG. 9($a$). As noted above, the perpendicular lengths were actually the distance of the active device area (i.e. Ca) from the edge of the barrier, and the devices were stored at 85° C. and 85% RH. Even under such harsh storage conditions, as can be seen in FIG. 9($b$), the inventors did not find an appreciable difference in the edge ingress performance of the three devices (that is, after 432 hrs, at 85° C. and 85% RH the buttons look the same regardless of the thickness of edge seal). In view of the results shown in FIG. 9($b$), a barrier film having a 3.0 mm perpendicular length or less (e.g. less than 2.0 mm, or less than 1.0 mm) of this exemplary barrier film comprising a mixture of polymeric material and a non-polymeric material can provide adequate resistance to the ingress of environmental permeants for at least 400 hrs or more at 85° C. and 85% RH.

In the exemplary devices described above, the barrier film that was deposited used HMDSO as the deposition precursor gas and oxygen as the non-deposition gas (i.e. a gas which will not deposit any film when run through the plasma by itself) in a PE-CVD system. However, as described in more detail below, other siloxanes or silazanes (or organosilicons in general), for example, can be used as precursors. The exemplary barrier film may be an intimate mixture of oxide with a little residual silicone, which may be unoxidized precursor. The refractive index for the exemplary barrier film may be a measure of its composition and to some extent density. A refractive index close to that of thermal SiO$_2$ would mean the film is more oxide like with high density. Exemplary deposition process and conditions and similar considerations are known in the art based patent applications U.S. Prov. Ser. No. 61/086,047 and U.S. Pat. No. 7,968,146, which are each herein incorporated by reference in their entireties. With increased nucleation density, even a thinner film may become continuous. Nucleation density can be controlled by various factors, such as deposition power, pressure, substrate temperature, and gas flow rates and ratio. Performing some surface treatment before the actual film deposition may also affect the interface. For examples, nitrogen plasma may leave some nitride bonds on the surface of a substrate and then a growing thin film may bond better to those bonds rather than with the substrate directly.

Composition and Fabrication of Exemplary Barrier Film

Provided below are exemplary compositions (and methods of fabricating such compositions) of barrier film molecules and materials that may be used as an edge sealant in some embodiments as described above. In this regard, exemplary embodiments of materials (and deposition processes) that may be used as an edge sealant are described in detail in U.S. Pat. No. 7,968,146 entitled "Hybrid Layers for Use in Coatings on Electronic Devices or Other Articles," which is hereby incorporated by references in its entirety for all purposes. The inventors have found that the materials and methods described in U.S. Pat. No. 7,968,146, some of which are provided below, may provide a barrier film that may be preferred for use as an edge sealant for electronic devices. However, embodiments are not necessarily limited to the molecules and methods described therein.

In this regard, and as was noted above, in some embodiments, the barrier film may comprise a hybrid layer comprising a mixture of a polymeric material and a non-polymeric material. The hybrid layer may have a single phase or multiple phases.

As used herein, the term "non-polymeric" may refer to a material made of molecules having a well-defined chemical formula with a single, well-defined molecular weight. A "nonpolymeric" molecule may have a significantly large molecular weight. In some circumstances, a non-polymeric molecule may include repeat units. As used herein, the term "polymeric" may refer to a material made of molecules that have repeating subunits that are covalently linked, and that has a molecular weight that may vary from molecule to molecule because the polymerizing reaction may result in different numbers of repeat units for each molecule. Polymers may include, but are not limited to, homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" may refer to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The polymeric/non-polymeric composition of a layer may be determined using various techniques, including wetting contact angles of water droplets, IR absorption, hardness, and flexibility. In certain instances, the hybrid layer has a wetting contact angle in the range 30° to 85°, and preferably, in the range of 30° to 60°, and more preferably, in the range of 36° to 60°. Note that the wetting contact angle is a measure of composition if determined on the surface of an as-deposited film. Because the wetting contact angle can vary greatly by post-deposition treatments, measurements taken after such treatments may not accurately reflect the layer's composition. It is believed that these wetting contact angles are applicable to a wide range of layers formed from organo-silicon precursors. In certain instances, the hybrid layer has a nano-indentation hardness in the range 3 to 20 GPa, and preferably, in the range of 10 to 18 GPa. In certain instances, the hybrid layer has a surface roughness (root-mean-square) in the range of 0.1 nm to 10 nm, and preferably, in the range of 0.2 nm to 0.35 nm. In certain instances, the hybrid layer, when deposited as a 4 mm thick layer on a 50 mm thick polyimide foil substrate, is sufficiently flexible that no microstructural changes are observed after at least 55,000 rolling cycles on a 1 inch diameter roll at a tensile strain (e) of 0.2%. In certain instances, the hybrid layer is sufficiently flexible that no cracks appear under a tensile strain (e) of at least 0.35% (typically a tensile strain level which would normally crack a 4 mm pure silicon oxide layer, as considered by a person of ordinary skill in the art).

It should be noted that the term "mixture" is intended to include compositions having a single phase as well as compositions having multiple phases. Therefore, a "mixture" excludes subsequently deposited alternating polymeric and non-polymeric layers. Put another way, to be considered a "mixture," a layer should be deposited under the same reaction conditions and/or at the same time.

The hybrid layer may be formed by chemical vapor deposition using a single precursor material (e.g. from a single source or multiple sources). As used herein, a "single source" of precursor material may refer to a source that provides all the precursor materials that are necessary to form both the polymeric and non-polymeric materials when the precursor material is deposited by CVD, with or without a reactant gas. This is intended to exclude methods where the polymeric material is formed using one precursor material, and the non-polymeric material is formed using a different precursor material. As would be appreciated by one of skill in the art, a "single source" of precursor material may include one or more containers (e.g. crucibles) that may be used during the process to heat or mix the chemicals that may form or contain a single precursor material. For instance, a single precursor material may be mixed or located in a plurality of containers and then vapor deposited. In general, by using a single precursor material, the deposition process may be simplified. For example, a single precursor material will obviate the need for separate streams of precursor materials and the attendant need to supply and control the separate streams.

In general, the precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO). Other precursors may also be utilized such as tetraethoxysilane (TEOS) or dimethyl siloxane (DMSO) or octamethylcyclotetrasiloxane orhexamethyldisilazane or other organosilanes or organosiloxanes and organosilazanes or their mixtures.

In some cases, plasma-enhanced CVD (PE-CVD) may be used for deposition of the hybrid layer. PE-CVD may be desirable for various reasons, including low temperature deposition, uniform coating formation, and controllable process parameters. Various PE-CVD processes that are suitable for use in forming a hybrid layer that may comprise a barrier layer for an edge sealant are known in the art, including those that use RF energy to generate the plasma.

The precursor material may be a material that is capable of forming both a polymeric material and a non-polymeric material when deposited by chemical vapor deposition. Various such precursor materials are suitable for use in providing a barrier film comprising a hybrid layer and may be chosen for their various characteristics. For example, a precursor material may be chosen for its content of chemical elements, its stoichiometric ratios of the chemical elements, and/or the polymeric and non-polymeric materials that are formed under CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organosilicon compounds suitable for use as a precursor material include: hexamethyldisilazane; divinyltetramethyldisilazane; hexamethylcyclotrisilazane; dimethylbis(N-methylacetamido)silane; dimethylbis-(N-ethylacetamido)silane; methylvinylbis(N-methylacetamido)silane; methylvinylbis (Nbutylacetamido)silane; methyltris(N-phenylacetamido) silane; vinyltris(N-ethylacetamido)silane; tetrakis (Nmethylacetamido)silane; diphenylbis(diethylaminoxy) silane; methyltris(diethylaminoxy)silane; and bis (trimethylsilyl)carbodiimide.

When deposited by CVD, the precursor material may form various types of polymeric materials in various amounts, depending upon the type of precursor material, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

When deposited by CVD, the precursor material may form various types of non-polymeric materials in various amounts, depending upon the type of precursor material, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, $SiO_2$, and mixed-valence oxides $SiO_x$. When deposited with a nitrogen-containing reactant gas, the non-polymeric material may include silicon nitrides ($SiN_x$). Other non-polymeric materials that may be formed in some instances include silicon oxycarbide and silicon oxynitrides.

When using PE-CVD, the precursor material may be used in conjunction with a reactant gas that reacts with the precursor material in the PE-CVD process. The use of reactant gases in PE-CVD is known in the art and various reactant gases are suitable for use in the present invention, including oxygen containing gases (e.g., $O_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

Thus, by using the exemplary methods as described above, it is possible to form a hybrid layer of hybrid polymeric/non-polymeric character and having characteristics suitable for use in various applications, particular as a barrier film to reduce edge ingress of permeates. Such characteristics of the barrier film may include optical transparency (e.g., in some cases, the hybrid layer may be optically transparent or semi-transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % of polymeric material may preferably be in the range of 5 to 95%, and more preferably in the range of 10 to 25%. However, other ranges are also possible depending upon the application.

EXEMPLARY EMBODIMENTS

Described below are exemplary embodiments of products that comprise a barrier film comprising a mixture of a polymeric material and a non-polymeric material as an edge sealant. The embodiments described herein are for illustration purposes only and are not thereby intended to be limiting. After reading this disclosure, it may be apparent to a person of ordinary skill in the art that various components and/or features as described below may be combined or omitted in certain embodiments, while still practicing the principles described herein.

In some embodiments, a first product is provided. The first product may include a substrate, a device having a device footprint disposed over the substrate, and a barrier film disposed over the substrate and substantially along a side of the active area. The barrier film may comprise a mixture of a polymeric material and non-polymeric material. The barrier film may have a perpendicular length that is less than or equal to 3 mm from the side of the device footprint.

As described above, the "perpendicular length" of the barrier film may refer to the distance from a portion of the barrier film that is disposed closest to the footprint of the device (e.g. adjacent to the active device area or inactive device area) to another portion of the barrier film that is disposed farthest away from the device footprint (e.g. the edge of the barrier film) in a direction that is perpendicular to the side of the device footprint and parallel to the surface of the substrate that the barrier film is disposed over.

As used in this context, "substantially along a side" of the device footprint does not necessarily require that the barrier film be disposed directly adjacent to the device footprint. Moreover, this does not preclude the barrier film from being disposed in other locations relative to the device, including embodiments where a portion of the barrier film may be disposed over one or more layers (such as a cathode, electron transport layer, hole transport layer, etc. of an OLED) of the device.

The use of the term "a perpendicular length" in the phrase "a barrier film may have a perpendicular length" is generally meant to cover embodiments where one portion of the barrier film may be deposited or otherwise fabricated so as to have a perpendicular length that is greater than 3.0 mm, so long as the edge of any portion of the barrier film is disposed so as at have a perpendicular distance that is less than 3.0 mm from a side of the footprint of the device. As was described above, the lifetime and performance of a device based on the ingress of contamination by outside particulates typically depends on the shortest or lease resistive path of ingress into the sensitive components of a device. The barrier film provided herein may be utilized such that the shortest part of horizontal ingress may be less than 3.0 mm (preferably less than 2.0 mm, and more preferably less than 1.0 mm).

In general, products that reduce the size of the barrier film that forms the edge seal (i.e. that reduce the perpendicular length) may provide for a reduction in the amount of border area (e.g. "dead space") of the device. Moreover, through the use of exemplary barrier film materials, embodiments provided herein may reduce the size of the non-active edge area without substantially affecting device performance or degradation. The exemplary barrier film may restrict both horizontal bulk permeation and permeation across the interface between the barrier film and the substrate. Reducing the non-active edge area of a device created by an edge seal may provide additional space for other electronic components of the device, larger displays, a reduction in the border area between emitting devices (which may make such areas less noticeable when, for instance, multiple displays or panels are tiled), or otherwise increase the efficiency of manufacturing or layout of such devices. Moreover, embodiments that utilize a single barrier film layer (e.g. that may be deposited in a single deposition step) to encapsulate the device may provide a more efficient and less time consuming fabrication process in comparison to products that utilize multilayer barriers (such as those described above with reference to FIGS. 3-5). However, embodiments are not so limited, and some products that have a barrier film that comprises a mixture of a polymeric material and non-polymeric material may also utilize multiple barrier or encapsulation layers (such as FIGS. 11-14).

In some embodiments, in the first product as described above, the device footprint may comprise an active device area and an inactive device area. In some embodiments, the barrier film may have a perpendicular length that is less than or equal to 3.0 mm from the side of the inactive device area. That is, the barrier film may be disposed so as to be adjacent to a side of the inactive device area and extend in a direction perpendicular to the side of the inactive area (and thereby the side of the device footprint of the device) by less than 3.0 mm (preferably less than 2.0 mm, and more preferably less than 1.0 mm). In some embodiments, the barrier film may not extend to a distance of greater than 3.0 mm from a side of the active device area. That is, in some instances, the barrier film may not be disposed adjacent to the side of the active device area (e.g. because the active device area may be surrounded by inactive device area) and thereby the perpendicular length of the barrier film may not correspond to the distance that the edge of the barrier film is disposed away from the side of the active device area. In some such embodiments, the total distance of the perpendicular length of the barrier film and the thickness of the inactive device area may be less than 3.0 mm from a side of the active area (preferably less than 2.0 mm; and more preferably less than 1.0 mm). In this manner, the border area of the device may be less than 3.0 mm (preferably less than 2.0 mm and more preferably less than 1.0 mm).

In some embodiments, in the first product as described above, the device footprint may comprise an active device area, and the barrier film may have a perpendicular length that is less than or equal to 3.0 mm from the side of the active device area (preferably less than 2.0 mm and more preferably less than 1.0 mm). That is, in some embodiments, the device may not comprise an inactive device area (or at least a portion of the device may not comprise an inactive device area), and thereby the barrier film may extend from the side of the active device area.

Examples of these concepts are illustrated in FIGS. 15-17. With reference to FIG. 15, a top view of an exemplary product 1500 comprising an OLED is shown. The product 1500 comprises a device having a device footprint 1501 disposed over the substrate 1510. The device footprint 1501 comprises an active device area 1550 and an inactive device area 1551. The product 1500 further comprises a cathode 1543 that is disposed partially within the device footprint 1501, but that also includes a cathode contact 1544 that extends away from the device footprint 1501 (to the right in FIG. 15), and an anode 1540 that is disposed partially within the device footprint 1501, but that has an anode contact 1541 that extends away from the device footprint 1501 (to the left in FIG. 15). The anode contact 1541 and the cathode contact 1544 may form one or more electrical contacts with electrical components (such as power source, drive circuitry, etc.) and can extend beyond the edge of the barrier film 1506 or be encapsulated by the barrier film 1506.

The device further comprises organic layers 1545 that are partially disposed within the active device area 1550 and the inactive device area 1551 of the device. The device further comprises a grid layer 1546 (which could comprise organic or inorganic material) that is shown as comprising a part of the inactive device area 1551, and a barrier film 1506 that is shown as comprising the non-device edge area 1553, as well as being disposed over the device and portions of the anode contact 1541 and cathode contact 1544. The non-device edge area 1553 and the inactive device area 1551 are shown as comprising the border (dead space) area 1552.

With reference to FIG. 16, the cross-section along the line A-A' of the exemplary product 1500 in FIG. 15 is shown. The product 1600 comprises a device disposed over the substrate 1610 having a device footprint 1601. The device footprint 1601 comprises an active device area 1650 and an inactive device area 1651. The product 1600 further comprises a cathode 1643 that is disposed partially within the device footprint 1601, but that also includes a cathode contact 1644 that extends away from the device footprint 1601 (to the right in FIG. 16), and an anode 1640 that is disposed partially within the device footprint 1601, but that has an anode contact 1641 that extends away from the device footprint 1601 (to the left in FIG. 16). The device further comprises organic layers 1645 that are partially disposed within the active device area 1650 and inactive device area 1651, a grid layer 1646 (which could comprise organic or inorganic material) that is shown as comprising a part of the inactive device area 1651, and a barrier film 1606 that is shown as comprising the non-device edge area 1653, as well as being disposed over the device and portions of the anode contact 1641 and cathode contact 1644. The non-device edge area 1653 and the inactive device area 1651 are shown as comprising the border (dead space) area 1652. Thus, in this example, the grid layer 1646 is shown as being disposed over anode contact 1641 (on the left side of the device) and over a portion of the anode 1644 and adjacent to substrate 1610 on the right side of the device. In this manner, the inactive device area 1651 may comprise two electrodes and the organic layer(s), this portion of the device may not emit light (e.g. for an OLED) and thereby does not comprise a part of the active device area 1650.

As shown in FIG. 16, in some embodiments, the barrier film 1603 may be disposed adjacent to the inactive device area 1651 (e.g. grid layer 1646 on the left side of the device in FIG. 16). Thus, the perpendicular length of the barrier film 1606 may correspond to the distance the barrier film 1606 extends away from the inactive device area 1651. On the opposite side of the device, the cathode contact 1644 extends beyond the grid layer 1646 (such that the grid layer 1646 insulates the anode 1640 and the cathode contact 1644). The barrier film 1606 is shown as being disposed adjacent to the cathode contact 1644 and extends away from the device footprint 1601. Thus, in this example, although the barrier film 1606 is disposed along a side of the device footprint 1601 (e.g. along the side of the inactive device area 1651) it is not disposed adjacent to the inactive device area 1651. As noted above, With reference to FIG. 17, a cross-sectional view along the line B-B' of the exemplary product 1500 shown in FIG. 15 is shown. The product 1700 comprises a device disposed over the substrate 1710 having a device footprint 1701. The device footprint 1701 comprises an active device area 1750 and an inactive device area 1751. The product 1700 further comprises a cathode 1743 that is disposed entirely within the device footprint 1701 (unlike FIG. 16) and an anode 1740 that is disposed entirely within the device footprint 1701 (again unlike FIG. 16). That is, the cathode and anode may, but need not, have contacts that extend beyond the device footprint 1701 in more than one direction. The device comprises organic layers 1745 that are partially disposed within the active device area 1750 and inactive device area 1751, a grid layer 1746 (which could comprise organic or inorganic materials) that is shown as comprising a part of the inactive device area 1751, and a barrier film 1706 that is shown as comprising the non-device edge area 1753, as well as being disposed over the device. In this example, the barrier film 1706 is shown as being disposed along a side of the inactive area 1751 of the device footprint 1701 on both sides of the device.

It should be noted that some of the additional detail and components shown in FIG. 1507 were omitted from the FIGS. 4-7 and 10-14 for illustration purposes only. That is, the embodiments shown in each of those figures could comprise some or all of the additional layers or materials shown and described in more detail with reference to FIGS. 15-17. However, these embodiments were described and shown at a high-level to demonstrate basic design and implementation concepts, and should thereby not be considered limiting.

In some embodiments, in the first product as described above, the barrier film may comprise a mixture of a polymeric silicon and inorganic silicon. The "mixture of polymeric silicon and inorganic silicon" was described above in detail, particular with reference to U.S. Pat. No. 7,968,146. The inventors have found that such a mixture may provide a barrier film that may be capable of restricting ingress of moisture or water vapor (or other environmental contaminants) while maintaining relatively small dimensions for the film. In the case of an edge sealant, the inventors have discovered that such materials may provide adequate performance while having a perpendicular length of less than 3.0 mm (preferably less than 2.0 mm; and more preferably less than 1.0 mm) from the side of the device footprint. Previously, edge seals often comprised multiple layers to achieve adequate performance, which is typically inefficient both to manufacture such devices and also creates relatively large non-active edge areas (and thereby border areas) on a product.

In some embodiments, the mixture of polymeric silicon and inorganic silicon may be substantially uniform across the layer. By "substantially," it is generally meant that the film comprises a mixture that does not vary by more than 5% across the layer. As noted above, the barrier film may be deposited in a single process, which may increase manufacturing efficiency. The 5% variance may account for minor fluctuations across the product that may occur during the manufacturing processes. For products that comprise a light emitting device (such as a lighting panel or display), a uniform layer may be preferred because it may reduce microcavity effects or other effects associated with multiple layers having different optical properties. However, embodiments are not so limited, and in some instances, the barrier film may vary across the layer (such as a graded layer), which could, for instance, increase the resistance to ingress across the bulk of the barrier layer.

In some embodiments, in the first product as described above, the barrier film may have a perpendicular length that is less than or equal to 2.0 mm. In some embodiments, the barrier film may have a perpendicular length that is less than or equal to 1.0 mm. As was described above, the barrier film comprising a mixture of a polymeric material and a non-polymeric material when utilized as an edge seal may reduce the size of the non-active edge area of the product in at least one direction, while still providing for adequate lifetime and performance of the device. In particular, the inventors have found that using the barrier film comprising a mixture of a polymeric material and non-polymeric material provides good performance when having a perpendicular length of less than 2.0 mm (and may even have similar performance at less than 1.0 mm). This is a substantial improvement over the distances typically required by multilayer products that were previously used, such as those shown in FIGS. 3-5.

In some embodiments, in the first product as described above, the barrier film may not have a perpendicular length that is greater than 3.0 mm. That is, some embodiments may not have a portion of the barrier film that is deposited or disposed at a location on the substrate so as to have a perpendicular distance that is greater than 3.0 mm from the side of the device footprint. For example, the barrier film comprising a mixture of a polymeric material and a non-polymeric material may be deposited around all of the sides of the device footprint at a distance of less than 3.0 mm. This may provide products that have a minimum amount of non-active edge area over the substrate, thereby allowing, for example, a display or lighting panel to extend closer to the edge of the product. Moreover, the inventors have unexpectedly found that such barrier films used as edge sealants have comparable performance when the barrier film may not have a perpendicular length that is greater than 2.0 mm (and preferably when the barrier film does not have a perpendicular length that is greater than 1 mm) from the side of the device footprint. Despite the reduction in the length of ingress path for such embodiments, as described with reference to FIGS. 9(a) and (b) and the corresponding experiments, the inventors have found an equal amount of contamination in comparable devices over an extended period of time in hostile environmental conditions. Thus, the inventors have discovered that the use of the barrier film comprising a mixture of a polymeric material and a non-polymeric material as an edge seal may be effective with perpendicular distances less than 3.0 mm (and even less than 2.0 mm or 1.0 mm).

In some embodiments, in the first product as described above, the barrier film may not have a perpendicular length that is greater than 3.0 mm or less than 1.0 mm. In some embodiments, the barrier film may not have a perpendicular length that is greater than 2.0 mm or less than 0.5 mm. That is, some embodiments of products may have an edge sealant having a range of perpendicular lengths around the device footprint, but in general it may be preferred that the range be great enough to provide adequate performance for the device, but sill have small enough dimensions so as to reduce the non-active edge area of the product.

In some embodiments, in the first product as described above, the barrier film may comprise a substantially uniform material. As used in this context, "uniform" may refer to when the material of the barrier layer comprises the same materials or concentration of materials across the layer. That is, "uniform" does not require that the film necessarily comprise only a single material, but could comprise a layer that has the same, or substantially the same, mixture across the layer. The use of the term "substantially" in this context is to account for minor variations that may occur based on manufacturing error or imperfections, but generally refers to uniformity that does not vary by more than 5% across the film. In some embodiments, the barrier film may comprise a uniform material—that is, there may be less than 1% variation across the film. The use of uniform (or substantially uniform) barrier films as edge sealants may be the result of using a single deposition process for depositing the film, which may reduce the costs of the fabrication process by reducing the number of fabrication steps/conditions.

In some embodiments, in the first product as described above, the barrier film may comprise a mixture of an oxide and polymeric silicone. In some embodiments, the barrier film may comprise at least 40% inorganic silicon. The inventors have found that the use of organic silicon and polymeric silicon may provide properties that are well-suited for forming an edge seal to prevent the ingress of contaminants in the device. It should be noted that the use of the term "at least" in this context does not require that the mixture or composition of the film be uniform—so long as there are no portions of the layer that comprise less than 40% inorganic silicon. In some embodiments, the barrier film may comprise at least 60% inorganic silicon. In some embodiments, the barrier film may comprise at least 80% inorganic silicon. As was noted above, the mixture concentrations and materials may be fine-tuned or selected to have desired characteristics so that the edge seal may be determined based on the particular application and environmental conditions expected for the device, as would be understood by one of ordinary skill in the art after reading this disclosure.

In this regard, in some embodiments, in the first product as described above, a surface of the barrier film may be disposed adjacent to a surface of the substrate to form a first interface.

The ratio of the index of refraction of the bulk of the barrier film and the index of refraction of a portion of the barrier film that is within 10 nm of the interface may be between 0.9993 and 0.9247. The "index of refraction of the bulk" of the barrier film may refer to the index of refraction across the barrier film layer (i.e. index of refraction across the film in a direction corresponding to a path that light that is perpendicularly incident on the film propagates through the layer). In general, the inventors have found that for products that may comprise a light emitting active area (such as an OLED) or any other transparent or semi-transparent device, it may be beneficial to deposit a barrier film such that the index of refraction of the film is similar to the substrate (particularly near the interface with the substrate). This may reduce the amount of light that may be trapped between the barrier film and the substrate and thereby increase the efficiency of the device. Moreover, less light may be color shifted or otherwise distorted when passing through the edge seal and then the substrate.

In some embodiments, in the first product as described above, where a surface of the barrier film is disposed adjacent to a surface of the substrate to form a first interface, the index of refraction of a portion of the barrier film that is within 10 nm of the interface may be between 1.35 and 1.459. In many embodiments, the substrate material may be transparent or semi-transparent such as a glass or plastic material and will typically have an index of refraction between 1.35 and 1.459. As was noted above, it is generally preferred (at least for devices comprising an emissive active area) that the index of refraction of the barrier film and the substrate are similar.

In some embodiments, in the first product as described above, where a surface of the barrier film is disposed adjacent to a surface of the substrate to form a first interface, the barrier film may comprise a material having a bulk diffusion coefficient of water vapor of less than $10^{-13}$ $cm^2/sec$. The bulk diffusion coefficient of the barrier film may refer to the rate of ingress of water vapor in the horizontal direction across the film (e.g. along Path-1 (704) in FIG. 7) or in the vertical direction (e.g. along Path-3 (707) in FIG. 7). The inventors have found that a bulk diffusion coefficient of less than $10^{-13}$ $cm^2/sec$ is generally sufficient to provide adequate device lifetime and performance, even in hostile environments as described above. In some embodiments, the diffusion coefficient of water vapor at the first interface may be between $10^{-8}$ $cm^2/sec$ and $10^{-13}$ $cm^2/sec$ when exposed to an ambient temperate of 65° C. and relative humidity of 85%. The diffusion coefficient at the interface corresponds to the ingress of moisture across the interface between the film and the substrate (e.g. along Path-2 (705) in FIG. 7), which may be the limiting factor in some embodiments for device lifetime or performance based on environmental contaminants. As was noted above, the inventors have found that a barrier film that comprises a mixture of a polymeric material and non-polymeric material may provide a sufficient diffusion coefficient at the interface for adequate device performance, even when the ingress path is less than 3.0 mm (preferably less than 2.0 mm; and more preferably less than 1.0 mm). As a person of ordinary skill in the art would understand, the properties of the edge seal (including the diffusion coefficient) may be tuned by adjusting the deposition conditions (including the precursor material) as was described above, to achieve a desired set of properties for the barrier film for a particular device or application.

In some embodiments, in the first product as described above, where a surface of the barrier film is disposed adjacent to a surface of the substrate to form a first interface, the barrier film may comprise a material having a bulk diffusion coefficient of water vapor. The ratio of the bulk diffusion coefficient of water vapor of the barrier film and a diffusion coefficient of water vapor near the first interface may be between 1 and $10^{-5}$. That is, for instance, the bulk diffusion coefficient for the barrier film (e.g. the ingress rate along Path-1 (704) in FIG. 7) may be equal to or less than the diffusion coefficient at or near the interface with the substrate (e.g. the ingress rate along Path-2 (705) in FIG. 7). As was noted above, in some embodiments, the ingress of water vapor along the interface may be the limiting factor in determining the lifetime or degradation of the device. The inventors have found that by tuning the properties of the barrier film, it is possible to adjust both the diffusion coefficient of the bulk material, as well as the diffusion coefficient along the interface with the substrate. In some embodiments, the ratio of the bulk diffusion coefficient of water vapor of the barrier film and a diffusion coefficient of water vapor within 10 nm of the first interface is between 1 and $10^{-5}$.

In some embodiments, in the first product as described above, the first product may further comprise a conductive layer disposed over the device (such as a layer of the device—e.g. an electrode). In some embodiments, a portion of the barrier film may be disposed at least partially over the conductive layer. In some embodiments, a portion of the barrier film may be disposed over the entire conductive layer. That is, for instance and as shown in FIGS. 7 and 15-17, in some embodiments, the barrier film may be used both as an edge seal and as an encapsulation layer over the entire device. This may reduce the cost and complexity of the fabrication process, as the barrier film could be deposited in a single step using a mask that is larger than the mask used for depositing the device footprint. Moreover, as noted above, the barrier film comprising a mixture of a polymeric material and non-polymeric material may have a low ingress rate based on the bulk diffusion coefficient and may thereby be utilized as an encapsulation layer for the device.

However, embodiments are not so limited, and in some instances, in the first product as described above where the device comprises a conductive layer disposed over one or more device layers, a top sealant layer may be disposed over the conductive layer. The top sealant layer and the barrier film may comprise different materials. Thus, the barrier film comprising a mixture of a polymeric material and non-polymeric material may be used in conjunction with other materials to encapsulate the device of the product. Examples of such embodiments are shown in FIGS. 11-14 and described in detail below.

In some embodiments, in the first product as described above, the first product may comprise a border area. The border area may have a thickness that is less than 3.0 mm (preferably less than 2.0 mm; and more preferably less than 1.0 mm) and may depend at least in part on the size of the barrier film and the size of the inactive device area. As was noted above, embodiments described herein that utilize a barrier film comprising a mixture of a polymeric material and non-polymeric material may have an effective edge seal against the ingress of environmental contaminants such that the size of the edge seal may be reduced. This may thereby allow for products to have smaller non-device edge areas around the active device area and inactive device areas of the device (thereby decreasing the size of the border area). Thus, as noted above, in some embodiments, in the first product as described above, where the first product comprises a non-device edge area, the non-device edge area may have a thickness that is less than 3.0 mm. In some embodiments, the non-active edge area may have a thickness that is less than 2.0 mm (preferably less than 1.0 mm).

In some embodiments, the first product as described above may comprise a consumer device. In some embodiments, the first product may comprise anyone of: a solar cell, a thin film battery, an organic electronic device, a lighting panel or a lighting source having a lighting panel, a display or an electronic device having a display, a mobile phone, a notebook computer, a tablet computer, or a television. In general, any product that uses a thin film to encapsulate or protect sensitive components may use the barrier film described herein comprising a mixture of polymeric material and non-polymeric material as an edge seal.

In some embodiments, in the first product as described above, the device may comprise an organic layer. In some embodiments, the organic layer may comprise an electroluminescent material. In some embodiments, the device may comprise an OLED. However, as noted above, while the inventors have found that the barrier film may perform particularly well as an edge sealant for an organic device (and thereby some of the examples and descriptions provided herein may reference OLEDs), embodiments are not so limited.

As was noted above, the barrier film that may be used as an edge sealant film may also be used in some embodiments as a top encapsulation film as shown in the exemplary embodiment in FIG. 10 or in conjunction with other top encapsulations as shown in FIGS. 11-14.

FIG. 10 shows an exemplary product 1000 that uses the barrier film as an edge seal and as a top sealant. The product 1000 comprises a substrate 1010, a device 1001 having a device footprint disposed over the substrate 1010, and a barrier film 1006 disposed along the sides of the device footprint and over the top of the device 1001. The barrier film 1006 is shown as having a perpendicular length of 1.0 mm. The two ingress paths (Path-1 (1004) and Path-2 (1005)) are shown. As noted above, such embodiments may provide for increased efficiency in the manufacturing process, as both the top encapsulation and the edge sealant comprise the same material (i.e. barrier film 1006).

As shown in FIG. 11, the edge sealant film 1106 can be used in conjunction with a single layer top encapsulation film. In this regard, the exemplary product 1100 comprises substrate 1110, a device 1101 disposed over the substrate 1110 having a device footprint, a barrier film 1106 disposed along the sides of the device footprint of device 1101, and a second barrier layer (or top encapsulation layer) 1108 disposed over the device footprint 1101. As noted above, utilizing the barrier film comprising a mixture of a polymeric material and non-polymeric material may enable the footprint of the single layer barrier film 1106 to be kept very close to that of the footprint of device 1101 (i.e. the perpendicular length of the barrier film 1106 extending away from the side of the footprint of device 1101 may be kept relatively small). In some embodiments, after the top encapsulation layer 1108 is formed or deposited, the barrier film 1106 that forms the edge seal may be deposited. The barrier film 1106 can be deposited just along the sides of the footprint of device 1101 as shown in FIG. 11 or it can also cover the top encapsulation layer 1108 depending on the needs of the device and the manufacturing requirements (that is, it may be more efficient and less expensive to deposit the barrier film 1106 as a blanket layer over the entire substrate 1110, rather than having to selectively deposit the barrier film 1106 only along the sides of the footprint of device 1101). In either embodiment, the use of the barrier film 1106 as the edge sealant may reduce the overall footprint of the encapsulation (i.e. the top encapsulation barrier 1108 and the edge sealant 1106). As shown in FIG. 11, in some embodiments, the perpendicular length of the barrier film 1106 may be equal to or less than 1.0 mm (i.e. the footprint of the barrier film 1106 may be less than 1.0 mm wider than the footprint of device 1101 on one or more sides). Similar to FIG. 11, the same principle is shown in FIG. 12 where the barrier film 1206 is used as the edge sealant for the device 1201 disposed over the substrate 1210 in conjunction with a multilayer barrier film (comprising inorganic 1202 and polymer 1203 layers) used as the top encapsulation. In this example, the barrier film 1206 is shown as having a perpendicular length of 1.0 mm.

As shown in FIG. 13, the barrier film may also be used along with glass encapsulation. In this regard, FIG. 13 shows an exemplary product 1300 comprising a substrate 1310, a device 1301 disposed over the substrate 1310 having a device footprint, a barrier film 1306 disposed along the sides of the footprint of the device 1301, and a top encapsulation comprising a glass layer 1311 and an epoxy 1312 (e.g. to couple the glass layer 1311 to the substrate 1310) disposed over the device 1301. In general, glass encapsulation typically suffers from the problem of edge ingress when the epoxy 1312 is used as the edge seals. If the epoxy 1312 can be deposited directly over the device 1301, the glass encapsulation 1311 may then be restricted to being disposed over the device 1301 only. In such a case, as shown in FIG. 13, the barrier film 1306 may be used as an edge sealant to cover the edges of the glass encapsulation 1311 and the epoxy seals 1312 to provide the edge seal for the glass encapsulation.

However, in some instances, the epoxy cannot be deposited directly on top of the device (or the layers disposed thereon). This is illustrated in FIG. 14, which shows an exemplary device 1400 comprising a substrate 1410, a device 1401 disposed over the substrate 1410 having a device footprint, a barrier film 1406 disposed along the sides the footprint of the device 1401, and a top encapsulation comprising the barrier film 1406, a glass layer 1411, and an epoxy 1412 (e.g. to couple the glass layer 1411 to the barrier film layer 1406) disposed over the device 1401. The barrier film 1406 can be used on top of the device 1401 to separate the epoxy 1412 from the active device area (or a layer disposed thereon) of the device 1401. The epoxy seal 1411 can then be deposited over the barrier film 1406, followed by the glass encapsulation 1411. Finally, the barrier film 1406 may be deposited so to form the edge seal along the sides of the footprint of device 1401, as shown in FIG. 14.

In some embodiments, a product may comprise a water vapor sensitive electronic component or layer (e.g. an electrode) that has an edge sealant barrier film deposited in a single chamber PE-CVD system using an organosilicon precursor. The composition of the edge sealant barrier film may not change substantially when observed moving away from the device footprint of the device, parallel to the substrate, from the inner edge to the outer edge of the barrier film, along the entire thickness of the barrier film, including the interface of the barrier film with the substrate. In some embodiments, the length of the interface of the barrier film with the substrate in a direction perpendicular to a side of the device footprint may be less than or equal to 3.0 mm. In some embodiments, the length of the interface of the barrier film with the substrate in a direction perpendicular to a side of the device footprint may be less than or equal to 2.0 mm. In some embodiments, the length of the interface of the barrier film with the substrate in a direction perpendicular to a side of the device footprint may be less than or equal to 1.0 mm.

In some embodiments, a product may be provide that comprises a water vapor sensitive electronic component or layer (such as an electrode) with an edge sealant comprising a barrier film deposited in a single chamber PE-CVD system using organosilicon precursor. The composition of the edge sealant barrier film may not change substantially when observed moving away from the device footprint, parallel to the substrate, from the inner edge to the outer edge of the barrier film, along the entire thickness of the barrier film, including the interface of the barrier film with the substrate. The composition and density of the edge sealant barrier film may be such that the ratio of the refractive index of the interface region of the barrier film close the substrate (i.e. within 10 nm) with that of the bulk of the barrier film is less than or equal to 0.9993 but greater than or equal to 0.9247.

In some embodiments, a product may be provided that comprises a water vapor sensitive electronic component or layer (such as an electrode) with an edge sealant barrier film deposited in a single chamber PE-CVD system using organosilicon precursor. The composition of the edge sealant barrier film may not change substantially when observed moving away from the device footprint of the device, parallel to the substrate, from the inner edge to the outer edge of the barrier film, along the entire thickness of the barrier film, including the interface of the barrier with the substrate. The composition and density of the barrier film may be such that the refractive index of the interface region close to the substrate (i.e. with in 10 nm) is more than 1.35 but less than 1.459.

In some embodiments, the bulk diffusion coefficient of water vapor in the barrier film may be less than $10^{-13}$ cm$^2$/sec and the diffusion coefficient of water vapor at the interface of the barrier film with the substrate may be less than or equal to $10^{-8}$, but greater than or equal to $10^{-13}$ cm$^2$/sec when the external environment is at 65° C. and 85% RH. In some embodiments, the ratio of the bulk diffusion coefficient of water vapor in the barrier film compared to the diffusion coefficient along the interface of the barrier film with the substrate may be less than or equal to 1.0 (i.e. they may be the same) but greater than or equal to $10^{-5}$. In some embodiments, the device may not show any edge shrinkage of the active area for 1,000 hrs of storage at 65° C. and 85% RH.

In addition to the products described above, the inventors have also found methods of manufacturing such products. In this regard, in some embodiments, a first method may comprise the steps of providing a substrate having a device disposed over the substrate having a device footprint, and fabricating a barrier film over the substrate and substantially along a side of the device footprint, where the barrier film may be fabricated so as to have a perpendicular length that is less than or equal to 3.0 mm (preferably less than 2.0 mm, and more preferably less than 1.0 mm) from the side of the device footprint. In some embodiments, the barrier film may comprise a mixture of a polymeric material and non-polymeric material.

The term "providing" is generally used in this context to be an inclusive term and encompass any manner of obtaining or making available a substrate having a device disposed over the substrate for use in such methods. For instance, in some embodiments, the substrate and the device (and/or components thereof) may be acquired, such as by purchase from a third party. In some embodiments, the substrate and/or active area could be fabricated, manufactured, or otherwise assembled, or the components could be provided to a third party that may then fabricate or assemble the substrate having a device disposed thereon.

Similarly, the term "fabricating" is also intended to be an inclusive term, and may comprise any suitable deposition process or other technique for disposing the barrier film over the substrate. This could include, by way of example only, vacuum depositing a blanket layer of barrier film over the substrate and etching, cutting, or ablating portions of the barrier film so that it has a perpendicular length that is less than 3.0 mm; deposition of the barrier film through a mask such that it has a perpendicular length that is less than 3.0 mm, or any other suitable method known in the art.

In some embodiments, in the first method as described above, the device may comprise an organic layer. In some embodiments, the organic layer may comprise an electroluminescent (EL) material. In some embodiments, the device may comprise an OLED. As noted above, although the inventors have found that the use of a barrier film having a perpendicular length that is less than 3.0 mm (such as when the barrier film comprises a mixture of a polymeric material and non-polymeric material) provide benefits to organic devices including increasing display and panel sizes (e.g. by decreasing border area (dead space)), embodiments are not so limited.

In some embodiments, in the first method as described above, the barrier film may be fabricated so as to have a perpendicular length that is less than or equal to 2.0 mm from the side of the device footprint. In some embodiments, the barrier film may be fabricated so as to have a perpendicular length that is less than or equal to 1.0 mm from the side of the device footprint. As noted above, in general a smaller perpendicular length for the barrier film may allow for a smaller border area of the product, thereby reducing the size of the product or reducing the inefficient use of space. As was described above with reference to an exemplary product, in some embodiments, the barrier film may be fabricated or disposed so that it does not have any perpendicular lengths from the side of the device footprint that are greater than 3.0 mm (preferably 2.0 mm, and more preferable greater than 1.0 mm).

In some embodiments, in the first method as described above, the step of fabricating the barrier film may comprise chemical vapor deposition. In some embodiments, the step of fabricating the barrier film may utilize an organosilicon precursor. However, as described above, the inventors have found that a variety of precursors may be used to fabricate barrier films that have desired properties to form an edge seal, and may be selected based on the particular application or device that the barrier film is being applied thereto.

In some embodiments, in the first method as decried above, the step of fabricating the barrier film so as to have a perpendicular length that is less than or equal to 3.0 mm from a side of the device footprint may comprise depositing the barrier film through a mask such that the perpendicular length is less than or equal to 3.0 mm from the side of the device footprint. The deposition may be performed in a vacuum process, such as CVD or PE-CVD.

In some embodiments, in the first method as described above, the step of fabricating the barrier film so as to have a perpendicular length that is less than or equal to 3.0 mm from the side of the device footprint may comprise the steps of: depositing a barrier film over the substrate and substantially along a side of the device footprint, wherein the barrier film is deposited so as to have a perpendicular length that is greater than or equal to 3.0 mm from the side of the device footprint, and, after depositing the barrier film, breaking the barrier film such that the barrier film has a perpendicular length that is less than or equal to 3.0 mm from the side of the device footprint. In some embodiments, the step of breaking the barrier film may be accomplished by, or in combination with, breaking the substrate. This exemplary fabrication method may provide for increased efficiencies (particularly where the barrier film is also disposed over device) because the barrier film may be deposited as a blanket layer over the substrate (e.g. a mask need not be precisely aligned for the deposition process). The substrate may be scribed (or ablated) at a predetermined location (e.g. within 3.0 mm, preferably within 2.0 mm, and more preferably within 1.0 mm of the side of the device footprint) so as to be broken along the scribe. When the substrate is broken, the size of the barrier film disposed on the portion of the substrate that the device footprint is also disposed on may be reduced.

It should be appreciated that the various characteristics described above with reference to the components of the first product may apply equally to the components described with respect to the first method, as would be understood by one of skill in the art. For example, the various descriptions of the composition of the barrier film, the fabrication of other components (such as top sealant or encapsulation layers) etc., may also be performed in accordance with the first method.

In some embodiments, a first product prepared by a process may be provided. The process for preparing the first product may comprise the steps of providing a substrate having a device disposed over the substrate having a device footprint, and fabricating a barrier film over the substrate and substantially along a side of the device footprint, where the barrier film may be fabricated so as to have a perpendicular length that is less than or equal to 3.0 mm from the side of the device footprint. In some embodiments, the barrier film may comprise a mixture of a polymeric material and non-polymeric material.

In some embodiments, in the first device prepared by a process as described above, the device may comprise an organic layer. In some embodiments, the organic layer may comprise an organic electroluminescent (EL) material. In some embodiments, the device may be an OLED.

In some embodiments, in the first product prepared by a process as described above, the barrier film may be fabricated so as to have perpendicular length that is less than or equal to 2.0 mm from the side of the device footprint. In some embodiments, the barrier film may be fabricated so as to have perpendicular length that is less than or equal to 1.0 mm from the side of the device footprint.

In some embodiments, in the first product prepared by a process as described above, the step of fabricating the barrier film may comprise depositing the first barrier film using an organosilicon precursor. As noted above, the inventors have found that the use of an organosilicon precursor may provide a barrier film that has particular properties that may be well-suited for use as an edge seal, which properties may be fine tuned based on the various deposition conditions and methods, as described above and would be appreciated by a person of ordinary skill in the art after reading this disclosure. However, any suitable precursor material may be utilized for some embodiments.

In some embodiments, the step of fabricating the barrier film may comprise chemical vapor deposition. In some embodiments, the step of fabricating the barrier film may comprise plasma enhance chemical vapor deposition (PE-CVD). In some embodiments, the barrier film consists essentially of a mixture of polymeric silicon and inorganic silicon, where the weight ratio of polymeric silicon to inorganic silicon is in the range of 95:5 to 5:95, and where the polymeric silicon and the inorganic silicon are created from the same precursor material. In some embodiments, at least an 0.1 µm thickness of the barrier film is deposited under the same reaction conditions for all the reaction conditions in the deposition process and the water vapor transmission rate is less than $10^{-6}$ g/m$^2$/day through the at least 0.1 µm thickness of the barrier film.

In some embodiments, in the first product prepared by a process as described above, where the step of fabricating the barrier film comprises depositing the first barrier film using an organosilicon precursor, the precursor material may comprise hexamethyl disiloxane or dimethyl siloxane. In some embodiments, the precursor material may comprise a single organosilicon compound. In some embodiments, the precursor material may comprise a mixture of organosilicon compounds.

In some embodiments, in the first product prepared by a process as described above, the step of fabricating the barrier film may comprise depositing the barrier film through a mask such that the perpendicular length is less than or equal to 3.0 mm from the side of the device footprint. In some embodiments, the perpendicular length may be less than or equal to 2.0 mm (and preferable less than 1.0 mm) from the side of the device footprint.

It should be appreciated that the various characteristics described above with reference to the components of the first product and the first method may apply equally to the embodiments that comprise the first product prepared by a process, as would be understood by one of skill in the art. This includes the various materials used, the structures created, and the characteristics of the product and/or the barrier film.

CONCLUSION

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary. Reference to a "first" component does not necessarily require that a second component be provided. Moreover reference to a "first" or a "second" component does not limit the referenced component to a particular location unless expressly stated.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

What is claimed is:

1. A first product comprising:
    a substrate;
    a device disposed over the substrate having a device footprint; and
    a barrier film disposed over the substrate and substantially along a side of the device footprint;
    wherein the barrier film comprises a mixture of a polymeric material and non-polymeric material; and
    wherein the barrier film has a perpendicular length that is less than or equal to 3.0 mm from the side of the device footprint.

2. The first product of claim 1,
    wherein the device footprint comprises an active device area and an inactive device area; and
    wherein the barrier film has a perpendicular length that is less than or equal to 3.0 mm from the side of the inactive device area.

3. The first product of claim 1,
    wherein the device footprint comprises an active device area and an inactive device area; and
    wherein the barrier film does not extend to a distance of greater than 3.0 mm from a side of the active device area.

4. The first product of claim 1, wherein the device footprint comprises an active device area, and wherein the barrier film has a perpendicular length that is less than or equal to 3.0 mm from the side of the active device area.

5. The first product of claim 1, wherein the barrier film comprises a mixture of a polymeric silicon and inorganic silicon.

6. The first product of claim 5, wherein the mixture of polymeric silicon and inorganic silicon is substantially uniform across the layer.

7. The first product of claim 1, wherein the barrier film does not have a perpendicular length that is greater than 3.0 mm.

8. The first product of claim 1, wherein the barrier film has a perpendicular length that is less than or equal to 1.0 mm.

9. The first product of claim 1, wherein the barrier film does not have a perpendicular length that is greater than 1.0 mm.

10. The first product of claim 1, wherein the barrier film does not have a perpendicular length that is greater than 3.0 mm or less than 1.0 mm.

11. The first product of claim 1, wherein the barrier film comprises a uniform material.

12. The first product of claim 1, wherein the barrier film comprises a mixture of an oxide and polymeric silicone.

13. The first product of claim 1, wherein the barrier film comprises at least 40% inorganic silicon.

14. The first product of claim 1, further comprising a conductive layer disposed over the active device area, wherein a portion of the barrier film is disposed at least partially over the conductive layer.

15. The first product of claim 1, further comprising a conductive layer disposed over the active device area;
    wherein a top sealant layer is disposed over the conductive layer; and
    wherein the top sealant layer and the barrier film comprise different materials.

16. The first product of claim 1, wherein the first product comprises any one of: a consumer device, a solar cell, a thin film battery, an organic electronic device, a lighting panel or a lighting source having a lighting panel, a display or an electronic device having a display, a mobile phone, a notebook computer, a tablet computer, a television, or an OLED.

17. A first method comprising:
    providing a substrate having a device disposed over the substrate having a device footprint; and
    fabricating a barrier film over the substrate and substantially along a side of the device footprint, wherein the barrier film is fabricated so as to have a perpendicular length that is less than or equal to 3.0 mm from the side of the device footprint, and wherein the barrier film comprises a mixture of a polymeric material and non-polymeric material.

18. The first method of claim 17, wherein the step of fabricating the barrier film comprises chemical vapor deposition.

19. The first method of claim 18, wherein the step of fabricating the barrier film utilizes an organosilicon precursor.

20. A first product prepared by a process comprising the steps of:
    providing a substrate having a device disposed over the substrate, wherein the device has a device footprint; and fabricating a barrier film over the substrate and substantially along a side of the device footprint, wherein the barrier film is fabricated so as to have a perpendicular length that is less than or equal to 3.0 mm from the side of the device footprint, and wherein the barrier film comprises a mixture of a polymeric material and non-polymeric material.

21. The first product of claim 20, wherein the step of fabricating the barrier film comprises depositing the first barrier film using an organosilicon precursor.

22. The first product of claim 21, wherein the step of fabricating the barrier film comprises chemical vapor deposition.

23. The first product of claim 21,
wherein the barrier film consists essentially of a mixture of polymeric silicon and inorganic silicon;
wherein the weight ratio of polymeric silicon to inorganic silicon is in the range of 95:5 to 5:95; and
wherein the polymeric silicon and the inorganic silicon are created from the same precursor material.

24. The first product of claim 23,
wherein at least an 0.1 μm thickness of the barrier film is deposited under the same reaction conditions for all the reaction conditions in the deposition process; and
wherein the water vapor transmission rate is less than $10^{-6}$ g/m$^2$/day through the at least 0.1 μm thickness of the barrier film.

* * * * *